(12) United States Patent
Elolampi et al.

(10) Patent No.: US 10,485,118 B2
(45) Date of Patent: Nov. 19, 2019

(54) MULTI-PART FLEXIBLE ENCAPSULATION HOUSING FOR ELECTRONIC DEVICES AND METHODS OF MAKING THE SAME

(71) Applicant: MC10, Inc., Lexington, MA (US)

(72) Inventors: Brian Elolampi, Belmont, MA (US); David G. Garlock, Derry, NH (US); Harold Gaudette, Cumberland, RI (US); Steven Fastert, Chelmsford, MA (US); Adam Standley, Boston, MA (US); Yung-Yu Hsu, San Jose, CA (US)

(73) Assignee: MC10, Inc., Lexington, MA (US)

( * ) Notice: Subject to any disclaimer, the term of this patent is extended or adjusted under 35 U.S.C. 154(b) by 0 days.

(21) Appl. No.: 15/119,559

(22) PCT Filed: Mar. 4, 2015

(86) PCT No.: PCT/US2015/018704
§ 371 (c)(1),
(2) Date: Aug. 17, 2016

(87) PCT Pub. No.: WO2015/134588
PCT Pub. Date: Sep. 11, 2015

(65) Prior Publication Data
US 2017/0223846 A1 Aug. 3, 2017

Related U.S. Application Data

(60) Provisional application No. 61/947,709, filed on Mar. 4, 2014.

(51) Int. Cl.
*H05K 5/00* (2006.01)
*H05K 1/18* (2006.01)
(Continued)

(52) U.S. Cl.
CPC .......... *H05K 5/0034* (2013.01); *H05K 1/181* (2013.01); *H05K 1/189* (2013.01); *H05K 3/284* (2013.01);
(Continued)

(58) Field of Classification Search
CPC .......... H05K 1/118; H05K 1/188–189; H05K 3/0014; H05K 23/552
(Continued)

(56) References Cited

U.S. PATENT DOCUMENTS 3,716,861 A 2/1973 Root
3,805,427 A 4/1974 Epstein
(Continued)

FOREIGN PATENT DOCUMENTS

CN 202068986 U 12/2011
DE 10 2007 046 886 A1 4/2009
(Continued)

OTHER PUBLICATIONS

Carvalhal et al., "Electrochemical Detection in a Paper-Based Separation Device", Analytical Chemistry, vol. 82, No. 3, (1162-1165) (4 pages) (Jan. 7, 2010).
(Continued)

*Primary Examiner* — Tuan T Dinh
(74) *Attorney, Agent, or Firm* — Nixon Peabody LLP

(57) ABSTRACT

Encapsulated conformal electronic devices, encapsulated conformal integrated circuit (IC) systems, and methods of making and using encapsulated conformal electronic devices are presented herein. A conformal IC device is disclosed which includes a flexible substrate, electronic circuitry attached to the flexible substrate, and a flexible multi-part encapsulation housing encasing therein the electronic circuitry and flexible substrate. The multi-part housing includes first and second encapsulation housing compo-
(Continued)

nents. The first encapsulation housing component has recessed regions for seating therein the electronic circuitry, while the second encapsulation housing component has recessed regions for seating therein the flexible substrate. First encapsulation housing component optionally includes a recessed region for seating therein the flexible substrate. Either housing component may include one or more projections that pass through holes in the substrate to engage complementary depressions in the other housing component to thereby align and interlock the encapsulation housing components with the flexible substrate and electronic circuitry.

24 Claims, 9 Drawing Sheets

(51) Int. Cl.
*H05K 3/28* (2006.01)
*H05K 3/32* (2006.01)
*H05K 5/06* (2006.01)

(52) U.S. Cl.
CPC .............. *H05K 3/32* (2013.01); *H05K 5/006* (2013.01); *H05K 5/0056* (2013.01); *H05K 5/065* (2013.01); *H05K 2201/09063* (2013.01); *H05K 2201/09872* (2013.01); *H05K 2201/10151* (2013.01); *H05K 2203/1311* (2013.01); *H05K 2203/1316* (2013.01)

(58) Field of Classification Search
USPC ........ 361/749–750, 760–763, 772–774, 784, 361/818; 174/254–258; 257/659–685, 257/787–790
See application file for complete search history.

(56) References Cited

U.S. PATENT DOCUMENTS

| | | | |
|---|---|---|---|
| 3,838,240 A | 9/1974 | Schelhorn | |
| 4,278,474 A | 7/1981 | Blakeslee | |
| 4,304,235 A | 12/1981 | Kaufman | |
| 4,416,288 A | 11/1983 | Freeman | |
| 4,658,153 A | 4/1987 | Brosh | |
| 4,911,169 A | 3/1990 | Ferrari | |
| 5,059,424 A | 10/1991 | Cartmell | |
| 5,272,375 A | 12/1993 | Belopolsky | |
| 5,306,917 A | 4/1994 | Black | |
| 5,326,521 A | 7/1994 | East | |
| 5,331,966 A | 7/1994 | Bennett | |
| 5,360,987 A | 11/1994 | Shibib | |
| 5,394,304 A * | 2/1995 | Jones ..................... B65B 53/02 | |
| | | | 174/256 |
| 5,471,982 A | 5/1995 | Edwards | |
| 5,454,270 A | 10/1995 | Brown | |
| 5,461,545 A * | 10/1995 | Leroy ..................... H05K 3/284 | |
| | | | 174/17.05 |
| 5,491,651 A | 2/1996 | Janic | |
| 5,567,975 A | 10/1996 | Walsh | |
| 5,580,794 A | 12/1996 | Allen | |
| 5,617,870 A | 4/1997 | Hastings | |
| 5,639,989 A * | 6/1997 | Higgins, III .......... H01L 23/552 | |
| | | | 174/386 |
| 5,811,790 A | 9/1998 | Endo | |
| 5,817,008 A | 10/1998 | Rafert | |
| 5,907,477 A | 5/1999 | Tuttle | |
| 6,063,046 A | 5/2000 | Allum | |
| 6,265,090 B1 | 7/2001 | Nishide | |
| 6,282,960 B1 | 9/2001 | Samuels | |
| 6,343,514 B1 | 2/2002 | Smith | |
| 6,387,052 B1 | 5/2002 | Quinn | |
| 6,410,971 B1 | 6/2002 | Otey | |
| 6,421,016 B1 | 7/2002 | Phillips | |
| 6,450,026 B1 | 9/2002 | Desarnaud | |
| 6,455,931 B1 | 9/2002 | Hamilton | |
| 6,567,158 B1 | 5/2003 | Falcial | |
| 6,596,937 B2 * | 7/2003 | Mazurkiewicz ...... H01L 23/552 | |
| | | | 174/394 |
| 6,626,940 B2 | 9/2003 | Crowley | |
| 6,628,987 B1 | 9/2003 | Hill | |
| 6,641,860 B1 | 11/2003 | Kaiserman | |
| 6,683,245 B1 * | 1/2004 | Ogawa ................. H05K 9/0037 | |
| | | | 174/382 |
| 6,775,906 B1 | 8/2004 | Silverbrook | |
| 6,784,844 B1 | 8/2004 | Boakes | |
| 6,965,160 B2 | 11/2005 | Cobbley | |
| 6,987,314 B1 | 1/2006 | Yoshida | |
| 7,259,030 B2 | 8/2007 | Daniels | |
| 7,265,298 B2 | 9/2007 | Maghribi | |
| 7,302,751 B2 | 12/2007 | Hamburgen | |
| 7,337,012 B2 | 2/2008 | Maghribi | |
| 7,487,587 B2 | 2/2009 | Vanfleteren | |
| 7,491,892 B2 | 2/2009 | Wagner | |
| 7,521,292 B2 | 4/2009 | Rogers | |
| 7,557,367 B2 | 7/2009 | Rogers | |
| 7,618,260 B2 | 11/2009 | Daniel | |
| 7,622,367 B1 | 11/2009 | Nuzzo | |
| 7,727,228 B2 | 6/2010 | Abboud | |
| 7,739,791 B2 | 6/2010 | Brandenburg | |
| 7,759,167 B2 | 7/2010 | Vanfleteren | |
| 7,815,095 B2 | 10/2010 | Fujisawa | |
| 7,960,246 B2 | 6/2011 | Flamand | |
| 7,982,296 B2 | 7/2011 | Nuzzo | |
| 8,097,926 B2 | 1/2012 | De Graff | |
| 8,198,621 B2 | 6/2012 | Rogers | |
| 8,207,473 B2 | 6/2012 | Axisa | |
| 8,217,381 B2 | 7/2012 | Rogers | |
| 8,332,053 B1 | 12/2012 | Patterson | |
| 8,372,726 B2 | 2/2013 | De Graff | |
| 8,389,862 B2 | 3/2013 | Arora | |
| 8,431,828 B2 | 4/2013 | Vanfleteren | |
| 8,440,546 B2 | 5/2013 | Nuzzo | |
| 8,536,667 B2 | 9/2013 | De Graff | |
| 8,552,299 B2 | 10/2013 | Rogers | |
| 8,618,656 B2 | 12/2013 | Oh | |
| 8,664,699 B2 | 3/2014 | Nuzzo | |
| 8,679,888 B2 | 3/2014 | Rogers | |
| 8,729,524 B2 | 5/2014 | Rogers | |
| 8,754,396 B2 | 6/2014 | Rogers | |
| 8,865,489 B2 | 10/2014 | Rogers | |
| 8,886,334 B2 | 11/2014 | Ghaffari | |
| 8,905,772 B2 | 12/2014 | Rogers | |
| 9,001,528 B2 * | 4/2015 | Yorita ................... H01L 21/565 | |
| | | | 361/816 |
| 9,012,784 B2 | 4/2015 | Arora | |
| 9,082,025 B2 | 7/2015 | Fastert | |
| 9,105,555 B2 | 8/2015 | Rogers | |
| 9,105,782 B2 | 8/2015 | Rogers | |
| 9,119,533 B2 | 9/2015 | Ghaffari | |
| 9,123,614 B2 | 9/2015 | Graff | |
| 9,159,635 B2 | 10/2015 | Elolampi | |
| 9,168,094 B2 | 10/2015 | Lee | |
| 9,171,794 B2 | 10/2015 | Rafferty | |
| 9,186,060 B2 | 11/2015 | De Graff | |
| 9,226,402 B2 | 12/2015 | Hsu | |
| 9,247,637 B2 | 1/2016 | Hsu | |
| 9,289,132 B2 | 3/2016 | Ghaffari | |
| 9,295,842 B2 | 3/2016 | Ghaffari | |
| 9,324,733 B2 | 4/2016 | Rogers | |
| 9,372,123 B2 | 6/2016 | Li | |
| 9,408,305 B2 | 8/2016 | Hsu | |
| 2001/0012918 A1 | 8/2001 | Swanson | |
| 2001/0021867 A1 | 9/2001 | Kordis | |
| 2001/0043513 A1 * | 11/2001 | Grupp ................... A44C 5/0015 | |
| | | | 368/281 |
| 2002/0000813 A1 | 1/2002 | Hirono | |
| 2002/0026127 A1 | 2/2002 | Balbierz | |
| 2002/0082515 A1 | 6/2002 | Campbell | |
| 2002/0094701 A1 | 7/2002 | Biegelsen | |
| 2002/0113739 A1 | 8/2002 | Howard | |
| 2002/0128700 A1 | 9/2002 | Cross, Jr. | |

(56) References Cited

U.S. PATENT DOCUMENTS

| | | |
|---|---|---|
| 2002/0145467 A1 | 10/2002 | Minch |
| 2002/0151934 A1 | 10/2002 | Levine |
| 2002/0158330 A1 | 10/2002 | Moon |
| 2002/0173730 A1 | 11/2002 | Pottgen |
| 2002/0193724 A1 | 12/2002 | Stebbings |
| 2003/0017848 A1 | 1/2003 | Engstrom |
| 2003/0045025 A1 | 3/2003 | Coyle |
| 2003/0097165 A1 | 5/2003 | Krulevitch |
| 2003/0120271 A1 | 6/2003 | Burnside |
| 2003/0162507 A1 | 8/2003 | Vatt |
| 2003/0214408 A1 | 11/2003 | Grajales |
| 2003/0236455 A1 | 12/2003 | Swanson |
| 2004/0006264 A1 | 1/2004 | Mojarradi |
| 2004/0085469 A1 | 5/2004 | Johnson |
| 2004/0092806 A1 | 5/2004 | Sagon |
| 2004/0106334 A1 | 6/2004 | Suzuki |
| 2004/0118831 A1 | 6/2004 | Martin |
| 2004/0135094 A1 | 7/2004 | Niigaki |
| 2004/0138558 A1 | 7/2004 | Dunki-Jacobs |
| 2004/0149921 A1 | 8/2004 | Smyk |
| 2004/0178466 A1 | 9/2004 | Merrill |
| 2004/0192082 A1 | 9/2004 | Wagner |
| 2004/0201134 A1 | 10/2004 | Kawai |
| 2004/0203486 A1 | 10/2004 | Shepherd |
| 2004/0221370 A1 | 11/2004 | Hannula |
| 2004/0243204 A1 | 12/2004 | Maghribi |
| 2005/0021103 A1 | 1/2005 | DiLorenzo |
| 2005/0029680 A1 | 2/2005 | Jung |
| 2005/0067293 A1 | 3/2005 | Naito |
| 2005/0070778 A1 | 3/2005 | Lackey |
| 2005/0096513 A1 | 5/2005 | Ozguz |
| 2005/0113744 A1 | 5/2005 | Donoghue |
| 2005/0139683 A1 | 6/2005 | Yi |
| 2005/0171524 A1 | 8/2005 | Stern |
| 2005/0203366 A1 | 9/2005 | Donoghue |
| 2005/0248312 A1 | 11/2005 | Cao |
| 2005/0261617 A1 | 11/2005 | Hall |
| 2005/0258050 A1 | 12/2005 | Bruce |
| 2005/0285262 A1 | 12/2005 | Knapp |
| 2006/0003709 A1 | 1/2006 | Wood |
| 2006/0038182 A1 | 2/2006 | Rogers |
| 2006/0071349 A1 | 4/2006 | Tokushige |
| 2006/0084394 A1 | 4/2006 | Engstrom |
| 2006/0106321 A1 | 5/2006 | Lewinsky |
| 2006/0122298 A1 | 6/2006 | Menon |
| 2006/0128346 A1 | 6/2006 | Yasui |
| 2006/0154398 A1 | 7/2006 | Qing |
| 2006/0160560 A1 | 7/2006 | Josenhans |
| 2006/0248946 A1 | 11/2006 | Howell |
| 2006/0257945 A1 | 11/2006 | Masters |
| 2006/0264767 A1 | 11/2006 | Shennib |
| 2006/0270135 A1 | 11/2006 | Chrysler |
| 2006/0286785 A1 | 12/2006 | Rogers |
| 2007/0027514 A1 | 2/2007 | Gerber |
| 2007/0031283 A1 | 2/2007 | Davis |
| 2007/0108389 A1 | 5/2007 | Makela |
| 2007/0113399 A1 | 5/2007 | Kumar |
| 2007/0123756 A1 | 5/2007 | Kitajima |
| 2007/0139451 A1 | 6/2007 | Somasiri |
| 2007/0179373 A1 | 8/2007 | Pronovost |
| 2007/0190880 A1 | 8/2007 | Dubrow |
| 2007/0270672 A1 | 11/2007 | Hayter |
| 2007/0270674 A1 | 11/2007 | Kane |
| 2008/0012154 A1* | 1/2008 | Chang .................. H05K 3/0014 257/787 |
| 2008/0036097 A1 | 2/2008 | Ito |
| 2008/0046080 A1 | 2/2008 | Vanden Bulcke |
| 2008/0074383 A1 | 3/2008 | Dean |
| 2008/0096620 A1 | 4/2008 | Lee |
| 2008/0139894 A1 | 6/2008 | Szydlo-Moore |
| 2008/0157235 A1 | 7/2008 | Rogers |
| 2008/0185534 A1 | 8/2008 | Simon |
| 2008/0188912 A1 | 8/2008 | Stone |
| 2008/0193749 A1 | 8/2008 | Thompson |
| 2008/0200973 A1 | 8/2008 | Mallozzi |
| 2008/0204021 A1 | 8/2008 | Leussler |
| 2008/0211087 A1 | 9/2008 | Mueller-Hipper |
| 2008/0237840 A1 | 10/2008 | Alcoe |
| 2008/0259576 A1 | 10/2008 | Johnson |
| 2008/0262381 A1 | 10/2008 | Kolen |
| 2008/0287167 A1 | 11/2008 | Caine |
| 2008/0313552 A1 | 12/2008 | Buehler |
| 2009/0000377 A1 | 1/2009 | Shipps |
| 2009/0001550 A1 | 1/2009 | Yonggang |
| 2009/0015560 A1 | 1/2009 | Robinson |
| 2009/0017884 A1 | 1/2009 | Rotschild |
| 2009/0048556 A1 | 2/2009 | Durand |
| 2009/0076363 A1 | 3/2009 | Bly |
| 2009/0088750 A1 | 4/2009 | Hushka |
| 2009/0107704 A1 | 4/2009 | Vanfleteren |
| 2009/0154736 A1 | 6/2009 | Lee |
| 2009/0184254 A1 | 7/2009 | Miura |
| 2009/0204168 A1 | 8/2009 | Kallmeyer |
| 2009/0215385 A1 | 8/2009 | Waters |
| 2009/0225751 A1 | 9/2009 | Koenck |
| 2009/0261828 A1 | 10/2009 | Nordmeyer-Massner |
| 2009/0273909 A1 | 11/2009 | Shin |
| 2009/0283891 A1 | 11/2009 | Dekker |
| 2009/0291508 A1 | 11/2009 | Babu |
| 2009/0294803 A1 | 12/2009 | Nuzzo |
| 2009/0322480 A1 | 12/2009 | Benedict |
| 2010/0002402 A1 | 1/2010 | Rogers |
| 2010/0030167 A1 | 2/2010 | Thirstrup |
| 2010/0059863 A1 | 3/2010 | Rogers |
| 2010/0072577 A1 | 3/2010 | Nuzzo |
| 2010/0073669 A1 | 3/2010 | Colvin |
| 2010/0087782 A1 | 4/2010 | Ghaffari |
| 2010/0090781 A1 | 4/2010 | Yamamoto |
| 2010/0090824 A1 | 4/2010 | Rowell |
| 2010/0116526 A1 | 5/2010 | Arora |
| 2010/0117660 A1 | 5/2010 | Douglas |
| 2010/0178722 A1 | 7/2010 | De Graff |
| 2010/0245011 A1 | 9/2010 | Chatzopoulos |
| 2010/0254092 A1 | 10/2010 | Dong |
| 2010/0271191 A1 | 10/2010 | De Graff |
| 2010/0298895 A1 | 11/2010 | Ghaffari |
| 2010/0317132 A1 | 12/2010 | Rogers |
| 2010/0321161 A1 | 12/2010 | Isabell |
| 2010/0327387 A1 | 12/2010 | Kasai |
| 2011/0011179 A1 | 1/2011 | Gustafsson |
| 2011/0034912 A1 | 2/2011 | De Graff |
| 2011/0051384 A1 | 3/2011 | Kriechbaum |
| 2011/0054583 A1 | 3/2011 | Litt |
| 2011/0071603 A1 | 3/2011 | Moore |
| 2011/0098583 A1 | 4/2011 | Pandia |
| 2011/0101789 A1 | 5/2011 | Salter |
| 2011/0121822 A1 | 5/2011 | Parsche |
| 2011/0140856 A1 | 6/2011 | Downie |
| 2011/0140897 A1 | 6/2011 | Purks |
| 2011/0175735 A1 | 7/2011 | Forster |
| 2011/0184320 A1 | 7/2011 | Shipps |
| 2011/0213559 A1 | 9/2011 | Pollack |
| 2011/0215931 A1 | 9/2011 | Callsen |
| 2011/0218756 A1 | 9/2011 | Callsen |
| 2011/0218757 A1 | 9/2011 | Callsen |
| 2011/0220890 A1 | 9/2011 | Nuzzo |
| 2011/0222375 A1 | 9/2011 | Tsubata |
| 2011/0263950 A1 | 10/2011 | Larson |
| 2011/0277813 A1 | 11/2011 | Rogers |
| 2011/0284268 A1 | 11/2011 | Palaniswamy |
| 2011/0306851 A1 | 12/2011 | Wang |
| 2011/0317737 A1 | 12/2011 | Klewer |
| 2012/0016258 A1 | 1/2012 | Webster |
| 2012/0051005 A1 | 3/2012 | Vanfleteren |
| 2012/0052268 A1 | 3/2012 | Axisa |
| 2012/0065937 A1 | 3/2012 | De Graff |
| 2012/0074546 A1 | 3/2012 | Chong |
| 2012/0087216 A1 | 4/2012 | Keung |
| 2012/0091594 A1 | 4/2012 | Landesberger |
| 2012/0092178 A1 | 4/2012 | Callsen |
| 2012/0092222 A1 | 4/2012 | Kato |
| 2012/0101413 A1 | 4/2012 | Beetel |
| 2012/0101538 A1 | 4/2012 | Ballakur |
| 2012/0108012 A1 | 5/2012 | Yasuda |

(56) References Cited

U.S. PATENT DOCUMENTS

| | | |
|---|---|---|
| 2012/0126418 A1 | 5/2012 | Feng |
| 2012/0150072 A1 | 6/2012 | Revol-Cavalier |
| 2012/0157804 A1 | 6/2012 | Rogers |
| 2012/0172697 A1 | 7/2012 | Urman |
| 2012/0178367 A1 | 7/2012 | Matsumoto |
| 2012/0226130 A1 | 9/2012 | De Graff |
| 2012/0244848 A1 | 9/2012 | Ghaffari |
| 2012/0256308 A1 | 10/2012 | Helin |
| 2012/0316455 A1 | 12/2012 | Rahman |
| 2012/0320558 A1* | 12/2012 | Foster ............... H05K 1/0218 361/818 |
| 2012/0327608 A1 | 12/2012 | Rogers |
| 2013/0041235 A1 | 2/2013 | Rogers |
| 2013/0085552 A1 | 4/2013 | Mandel |
| 2013/0099358 A1 | 4/2013 | Elolampi |
| 2013/0100618 A1 | 4/2013 | Rogers |
| 2013/0116520 A1 | 5/2013 | Roham |
| 2013/0118255 A1 | 5/2013 | Callsen |
| 2013/0123587 A1 | 5/2013 | Sarrafzadeh |
| 2013/0147063 A1 | 6/2013 | Park |
| 2013/0150693 A1 | 6/2013 | D'angelo |
| 2013/0185003 A1 | 7/2013 | Carbeck |
| 2013/0192356 A1 | 8/2013 | De Graff |
| 2013/0197319 A1 | 8/2013 | Monty |
| 2013/0200268 A1 | 8/2013 | Rafferty |
| 2013/0211761 A1 | 8/2013 | Brandsma |
| 2013/0214300 A1 | 8/2013 | Lerman |
| 2013/0215467 A1 | 8/2013 | Fein |
| 2013/0225965 A1 | 8/2013 | Ghaffari |
| 2013/0237150 A1 | 9/2013 | Royston |
| 2013/0245388 A1 | 9/2013 | Rafferty |
| 2013/0253285 A1 | 9/2013 | Bly |
| 2013/0274562 A1 | 10/2013 | Ghaffari |
| 2013/0313713 A1 | 11/2013 | Arora |
| 2013/0316442 A1 | 11/2013 | Meurville |
| 2013/0316487 A1 | 11/2013 | De Graff |
| 2013/0316645 A1 | 11/2013 | Li |
| 2013/0320503 A1 | 12/2013 | Nuzzo |
| 2013/0321373 A1 | 12/2013 | Yoshizumi |
| 2013/0328219 A1 | 12/2013 | Chau |
| 2013/0331914 A1 | 12/2013 | Lee |
| 2014/0001058 A1 | 1/2014 | Ghaffari |
| 2014/0012160 A1 | 1/2014 | Ghaffari |
| 2014/0012242 A1 | 1/2014 | Lee |
| 2014/0022746 A1 | 1/2014 | Hsu |
| 2014/0039290 A1 | 2/2014 | De Graff |
| 2014/0097944 A1 | 4/2014 | Fastert |
| 2014/0110859 A1 | 4/2014 | Rafferty |
| 2014/0125458 A1 | 5/2014 | Bachman |
| 2014/0140020 A1 | 5/2014 | Rogers |
| 2014/0188426 A1 | 7/2014 | Fastert |
| 2014/0191236 A1 | 7/2014 | Nuzzo |
| 2014/0206976 A1 | 7/2014 | Thompson |
| 2014/0216524 A1 | 8/2014 | Rogers |
| 2014/0240932 A1 | 8/2014 | Hsu |
| 2014/0249520 A1 | 9/2014 | Ghaffari |
| 2014/0303452 A1 | 10/2014 | Ghaffari |
| 2014/0303680 A1 | 10/2014 | Donnelly |
| 2014/0308930 A1 | 10/2014 | Tran |
| 2014/0340857 A1 | 11/2014 | Hsu |
| 2014/0374872 A1 | 12/2014 | Rogers |
| 2014/0375465 A1 | 12/2014 | Fenuccio |
| 2015/0001462 A1 | 1/2015 | Rogers |
| 2015/0019135 A1 | 1/2015 | Kacyvenski |
| 2015/0025394 A1 | 1/2015 | Hong |
| 2015/0035680 A1 | 2/2015 | Li |
| 2015/0069617 A1 | 3/2015 | Arora |
| 2015/0099976 A1 | 4/2015 | Ghaffari |
| 2015/0100135 A1 | 4/2015 | Ives |
| 2015/0146396 A1* | 5/2015 | Sorenson ............... H05K 1/185 361/760 |
| 2015/0194817 A1 | 7/2015 | Lee |
| 2015/0237711 A1 | 8/2015 | Rogers |
| 2015/0241288 A1 | 8/2015 | Keen |
| 2015/0260713 A1 | 9/2015 | Ghaffari |
| 2015/0272652 A1 | 10/2015 | Ghaffari |
| 2015/0286913 A1 | 10/2015 | Fastert |
| 2015/0320472 A1 | 11/2015 | Ghaffari |
| 2015/0335254 A1 | 11/2015 | Elolampi |
| 2015/0342036 A1 | 11/2015 | Fastert |
| 2016/0027834 A1 | 1/2016 | de Graff |
| 2016/0045162 A1 | 2/2016 | De Graff |
| 2016/0081192 A1 | 3/2016 | Hsu |
| 2016/0086909 A1 | 3/2016 | Garlock |
| 2016/0095652 A1 | 4/2016 | Lee |
| 2016/0099214 A1 | 4/2016 | Dalal |
| 2016/0099227 A1 | 4/2016 | Dalal |
| 2016/0111353 A1 | 4/2016 | Rafferty |
| 2016/0135740 A1 | 5/2016 | Ghaffari |
| 2016/0178251 A1 | 6/2016 | Johnson |
| 2016/0213262 A1 | 7/2016 | Ghaffari |
| 2016/0213424 A1 | 7/2016 | Ghaffari |
| 2016/0228640 A1 | 8/2016 | Pindado |
| 2016/0232807 A1 | 8/2016 | Ghaffari |
| 2016/0240061 A1 | 8/2016 | Li |
| 2016/0249174 A1 | 8/2016 | Patel |
| 2016/0256070 A1 | 9/2016 | Murphy |
| 2016/0287177 A1 | 10/2016 | Huppert |
| 2016/0293794 A1 | 10/2016 | Nuzzo |
| 2016/0309594 A1 | 10/2016 | Hsu |
| 2016/0322283 A1 | 11/2016 | McMahon |

FOREIGN PATENT DOCUMENTS

| | | |
|---|---|---|
| EP | 0585670 A2 | 3/1994 |
| EP | 0779059 A1 | 6/1997 |
| EP | 1808124 A2 | 7/2007 |
| EP | 2259062 A2 | 12/2010 |
| JP | 01-076878 A | 3/1989 |
| JP | 05-087511 A | 4/1993 |
| JP | 05-502142 A | 4/1993 |
| JP | 07-508114 A | 9/1995 |
| JP | 10-155753 A | 6/1998 |
| JP | 2002-090479 A | 3/2002 |
| JP | 2003-046291 A | 2/2003 |
| JP | 2003-510006 A | 3/2003 |
| JP | 2005-052212 A | 3/2005 |
| JP | 2009-170173 A | 7/2009 |
| JP | 2013-089959 A | 5/2013 |
| JP | 2013-536592 A | 9/2013 |
| WO | WO 98/39057 A1 | 9/1998 |
| WO | WO 1999/038211 A2 | 7/1999 |
| WO | WO 2005/122285 A2 | 12/2005 |
| WO | WO 2003/021679 A2 | 3/2006 |
| WO | WO 2007/003019 A2 | 1/2007 |
| WO | WO 2007/024983 A2 | 3/2007 |
| WO | WO 2007/116344 A1 | 10/2007 |
| WO | WO 2007/136726 A2 | 11/2007 |
| WO | WO 2008/030960 A2 | 3/2008 |
| WO | WO 2009/111641 A1 | 9/2009 |
| WO | WO 2009/114689 A1 | 9/2009 |
| WO | WO 2010/036807 A1 | 4/2010 |
| WO | WO 2010/042653 A1 | 4/2010 |
| WO | WO 2010/042957 A2 | 4/2010 |
| WO | WO 2010/046883 A1 | 4/2010 |
| WO | WO 2010/056857 A2 | 5/2010 |
| WO | WO 2010/081137 A2 | 7/2010 |
| WO | WO 2010/082993 A2 | 7/2010 |
| WO | WO 2010/102310 A2 | 9/2010 |
| WO | WO 2010/132552 A1 | 11/2010 |
| WO | WO 2011/003181 A1 | 1/2011 |
| WO | WO 2011/041727 A1 | 4/2011 |
| WO | WO 2011/084450 A1 | 7/2011 |
| WO | WO 2011/084709 A2 | 7/2011 |
| WO | WO 2011/124898 A1 | 10/2011 |
| WO | WO 2011/127331 A2 | 10/2011 |
| WO | WO 2012/125494 A2 | 9/2012 |
| WO | WO 2012/166686 A2 | 12/2012 |
| WO | WO 2013/010171 A1 | 1/2013 |
| WO | WO 2013/022853 A1 | 2/2013 |
| WO | WO 2013/033724 A1 | 3/2013 |
| WO | WO 2013/034987 A3 | 3/2013 |
| WO | WO 2013/049716 A1 | 4/2013 |
| WO | WO 2013/052919 A2 | 4/2013 |

(56) References Cited

FOREIGN PATENT DOCUMENTS

| WO | WO 2013/170032 A2 | 11/2013 |
| WO | WO 2014/007871 A1 | 1/2014 |
| WO | WO 2014/058473 A1 | 4/2014 |
| WO | WO 2014/059032 A1 | 4/2014 |
| WO | WO 2014/106041 A1 | 7/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |
| WO | WO 2015/054312 A1 | 4/2015 |
| WO | WO 2015/077559 A1 | 5/2015 |
| WO | WO 2015/080991 A1 | 6/2015 |
| WO | WO 2015/102951 A2 | 7/2015 |
| WO | WO 2015/103483 A1 | 7/2015 |
| WO | WO 2015/103580 A2 | 7/2015 |
| WO | WO 2015/127458 A1 | 8/2015 |
| WO | WO 2015/134588 A1 | 9/2015 |
| WO | WO 2015/138712 A1 | 9/2015 |
| WO | WO 2015/145471 A1 | 10/2015 |
| WO | WO 2016/048888 A1 | 3/2016 |
| WO | WO 2016/054512 A1 | 4/2016 |
| WO | WO 2016/057318 A1 | 4/2016 |
| WO | WO 2016/081244 A1 | 5/2016 |
| WO | WO 2016/0127050 A1 | 8/2016 |
| WO | WO 2016/134306 A1 | 8/2016 |
| WO | WO 2016-140961 A1 | 9/2016 |

OTHER PUBLICATIONS

Demura et al., "Immobilization of Glucose Oxidase with *Bombyx mori* Silk Fibroin by Only Stretching Treatment and its Application to Glucose Sensor," Biotechnology and Bioengineering, vol. 33, 598-603 (6 pages) (1989).

Ellerbee et al., "Quantifying Colorimetric Assays in Paper-Based Microfluidic Devices by Measuring the Transmission of Light through Paper," Analytical Chemistry, vol. 81, No. 20 8447-8452, (6 pages) (Oct. 15, 2009).

Halsted, "Ligature and Suture Material," Journal of the American Medical Association, vol. LX, No. 15, 1119-1126, (8 pages) (Apr. 12, 1913).

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).

Kim et al., "Dissolvable Films of Silk Fibroin for Ultrathin Conformal Bio-Integrated Electronics," Nature, 1-8 (8 pages) (Apr. 18, 2010).

Kim et al., "Materials and Noncoplanar Mesh Designs for Integrated Circuits with Linear Elastic Responses to Extreme Mechanical Deformations," PNAS, vol. 105, No. 48, 18675-18680 (6 pages) (Dec. 2, 2008).

Kim et al., "Stretchable and Foldable Silicon Integrated Circuits," Science, vol. 320, 507-511 (5 pages) (Apr. 25, 2008).

Kim et al., "Electrowetting on Paper for Electronic Paper Display," ACS Applied Materials & Interfaces, vol. 2, No. 11, (3318-3323) (6 pages) (Nov. 24, 2010).

Ko et al., "A Hemispherical Electronic Eye Camera Based on Compressible Silicon Optoelectronics," Nature, vol. 454, 748-753 (6 pages) (Aug. 7, 2008).

Lawrence et al., "Bioactive Silk Protein Biomaterial Systems for Optical Devices," Biomacromolecules, vol. 9, 1214-1220 (7 pages) (Nov. 4, 2008).

Meitl et al., "Transfer Printing by Kinetic Control of Adhesion to an Elastomeric Stamp," Nature, vol. 5, 33-38 (6 pages) (Jan. 2006).

Omenetto et al., "A New Route for Silk," Nature Photonics, vol. 2, 641-643 (3 pages) (Nov. 2008).

Omenetto et al., "New Opportunities for an Ancient Material," Science, vol. 329, 528-531 (5 pages) (Jul. 30, 2010).

Siegel et al., "Foldable Printed Circuit Boards on Paper Substrates," Advanced Functional Materials, vol. 20, No. 1, 28-35, (8 pages) (Jan. 8, 2010).

Tsukada et al., "Structural Changes of Silk Fibroin Membranes Induced by Immersion in Methanol Aqueous Solutions," Journal of Polymer Science, vol. 32, 961-968 (8 pages) (1994).

Wang et al., "Controlled Release From Multilayer Silk Biomaterial Coatings to Modulate Vascular Cell Responses" Biomaterials, 29, 894-903 (10 pages) (Nov. 28, 2008).

Wikipedia, "Ball bonding" article [online]. Cited in PCT/US2015/051210 search report dated Mar. 1, 2016 with the following information "Jun. 15, 2011 [retrieved on Nov. 15, 2015}. Retrieved 12-18, 29 from the Internet: <URL: https://web.archive.org/web/20110615221003/http://en.wikipedia.org/wiki/Ball_bonding>. entire document, especially para 1, 4, 5, 6," 2 pages, last page says ("last modified on May 11, 2011").

Bossuyt et al., "Stretchable Electronics Technology for Large Area Applications: Fabrication and Mechanical Characterizations", vol. 3, pp. 229-235 (7 pages) (Feb. 2013).

Jones et al., "Stretchable Interconnects for Elastic Electronic Surfaces". vol. 93, pp. 1459-1467 (9 pages) (Aug. 2005).

Lin et al., "Design and Fabrication of Large-Area, Redundant, Stretchable Interconnect Meshes Using Excimer Laser Photoablation and In Situ Masking", (10 pages) (Aug. 2010).

Kim et al., "A Biaxial Stretchable Interconnect With Liquid-Alloy-Covered Joints on Elastomeric Substrate", vol. 18, pp. 138-146 (9 pages) (Feb. 2009).

International Search Report, PCT/US2015/018704, dated Jun. 25, 2015 (3 pages).

Written Opinion of the International Searching Authority, PCT/US2015/018704, dated Jun. 25, 2015 (7 pages).

\* cited by examiner

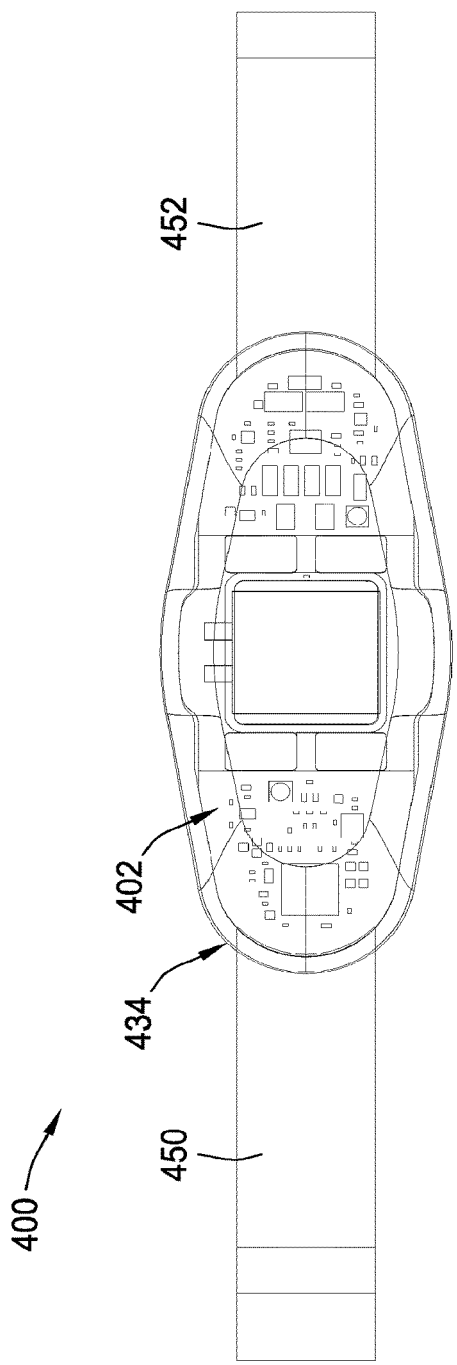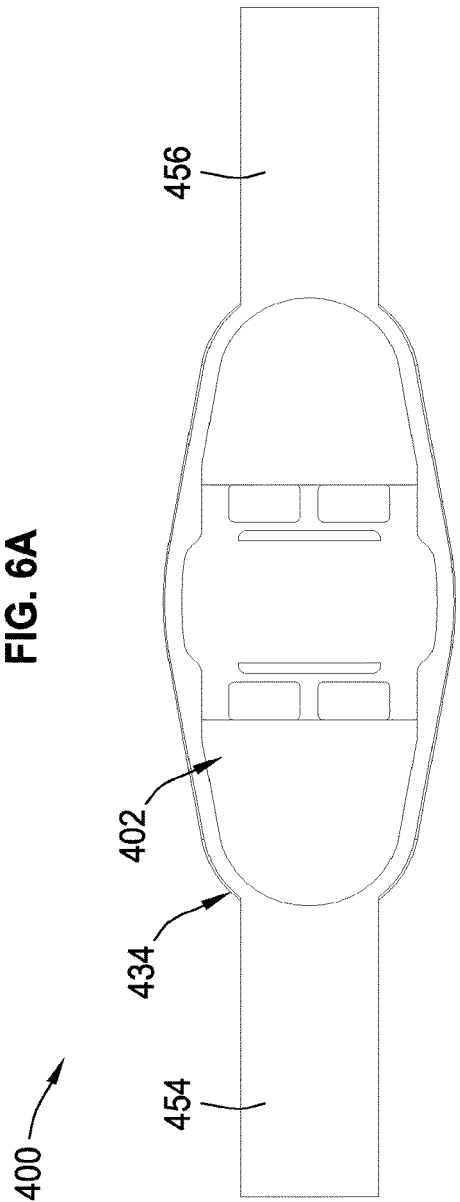

MULTI-PART FLEXIBLE ENCAPSULATION HOUSING FOR ELECTRONIC DEVICES AND METHODS OF MAKING THE SAME

CROSS-REFERENCE TO RELATED PATENT APPLICATIONS

This application is a U.S. National Stage of International Application No. PCT/US2015/018704, filed Mar. 4, 2015, entitled "Conformal Electronic Devices with Multi-Part Flexible Encapsulation Housing," which claims the benefit of priority to U.S. Provisional Patent Application No. 61/947,709, which was filed on Mar. 4, 2014, and both of which are incorporated herein by reference in their entireties and for all purposes.

TECHNICAL FIELD

Aspects of the present disclosure relate generally to flexible and stretchable integrated circuit (IC) electronics. More particularly, aspects of this disclosure relate to conformal electronic systems with encapsulated IC device islands.

BACKGROUND

Integrated circuits (IC) are the cornerstone of the information age and the foundation of today's information technology industries. The integrated circuit, a.k.a. "microchip," is a set of interconnected electronic components, such as transistors, capacitors, and resistors, which are etched or imprinted onto a tiny wafer of semiconducting material, such as silicon or germanium. Integrated circuits take on various forms including, as some non-limiting examples, microprocessors, amplifiers, Flash memories, application specific integrated circuits (ASICs), static random access memories (SRAMs), digital signal processors (DSPs), dynamic random access memories (DRAMs), erasable programmable read only memories (EPROMs), and programmable logic. Integrated circuits are used in innumerable products, including personal computers, laptop and tablet computers, smartphones, flat-screen televisions, medical instruments, telecommunication and networking equipment, airplanes, watercraft and automobiles.

Advances in integrated circuit technology and microchip manufacturing have led to a steady decrease in chip size and an increase in circuit density and circuit performance. The scale of semiconductor integration has advanced to the point where a single semiconductor chip can hold tens of millions to over a billion devices in a space smaller than a U.S. penny. Moreover, the width of each conducting line in a modern microchip can be made as small as a fraction of a nanometer. The operating speed and overall performance of a semiconductor chip (e.g., clock speed and signal net switching speeds) has concomitantly increased with the level of integration. To keep pace with increases in on-chip circuit switching frequency and circuit density, semiconductor packages currently offer higher pin counts, greater power dissipation, more protection, and higher speeds than packages of just a few years ago.

Conventional microchips are generally rigid structures that are not designed to be bent or stretched during normal operating conditions. Likewise, most microchips and other IC modules are typically mounted on a printed circuit board (PCB) that is similarly rigid and unstretchable. Processes using rigid IC's and rigid PCB's are generally incompatible for applications requiring stretchable or bendable electronics. Consequently, many schemes have been proposed for embedding microchips on or in a flexible polymeric substrate. This, in turn, enables many useful device configurations not otherwise possible with rigid silicon-based electronic devices. However, many of these schemes use embedded chips that are thicker than the individual layers of flexible polymer that make up the flexible printed circuit board assembly (FPCBA). Such schemes are not compatible for "thin chip" configurations. In addition, available processes for making flexible circuits oftentimes require multiple layers of expensive materials, which not only increases material and manufacturing costs but also results in a composite structure that is undesirably thick.

SUMMARY

Disclosed herein are encapsulated conformal electronic devices and conformal electronic systems with encapsulated integrated circuit (IC) device islands, including methods of making and methods of using the same. By way of example, there are described systems and methods for encapsulating conformal electronic devices, such as conformal electronic sensor assemblies. Said sensor assemblies may be used, for example, for sensing, measuring, or otherwise quantifying motion, including motion and/or muscle activity of at least one body part of a mammalian subject. In some examples, such conformal electronic sensor assemblies can be configured to attach directly to, lie against, and/or monitor motion of a human body part. Disclosed encapsulation methods can, for example, increase the durability, comfort, and/or aesthetic appeal of the conformal electronic devices described herein, as well as provide, for example, versatility, cost savings, and scale-up capability.

Aspects of the present disclosure are directed to conformal integrated circuit (IC) devices. In an embodiment, a conformal IC device includes a flexible substrate, electronic circuitry attached to the flexible substrate, and a flexible multi-part encapsulation housing substantially or completely encasing therein the electronic circuitry and flexible substrate. The multi-part encapsulation housing includes a first (top) encapsulation housing component that is attached to a second (bottom) encapsulation housing component. The first encapsulation housing component has at least one first recessed region for seating therein the electronic circuitry, while the second encapsulation housing component has at least one second recessed region for seating therein the flexible substrate.

The first encapsulation housing component may further comprise at least one recessed region for seating therein part of the flexible substrate. In some embodiments, the electronic circuitry comprises spaced IC devices that are electrically connected via electrical interconnects. The first encapsulation housing component may comprise pockets and/or tracks for seating therein the device islands and the electrical interconnects. For some configurations, one or both encapsulation housing components may have at least one projection that passes through at least one through hole in the flexible substrate and engages at least one complementary depression in the other encapsulation housing component to thereby align and interlock the first and second encapsulation housing components with the flexible substrate and the electronic circuitry. Optionally, one or both encapsulation housing components may have at least one projection that passes into at least one of the through holes in the flexible substrate to thereby align and interlock that housing component with the flexible substrate and the electronic circuitry.

For some configurations, the flexible multi-part encapsulation housing has a durometer hardness rating of about 20 Shore A and a tear strength of at least about 80 pounds per inch (ppi). The flexible multi-part encapsulation housing, for some implementations, is fabricated from a stretchable and bendable non-conductive material. For instance, the first and second encapsulation housing components are molded from liquid silicone rubber (LSR) materials in a liquid injection molding (LIM) process. These encapsulation housing components are then adhered together such that the flexible substrate and the electronic circuitry are sandwiched between the first and second encapsulation housing components. Flexible multi-part encapsulation housing can be designed to hermetically seal the flexible substrate and the electronic circuitry. The flexible substrate and electronic circuitry cooperatively form a flexible printed circuit board assembly (FPCBA). The electronic circuitry may comprise an integrated circuit sensor system with at least one sensing device and at least one controller device.

According to other aspects of the present disclosure, conformal electronics devices are disclosed. In an embodiment, an encapsulated conformal electronics device is presented which includes a flexible printed circuit board (FPCB) and a plurality of surface-mount technology (SMT) components configured as integrated circuit (IC) device islands mounted on the FPCB. Stretchable interconnects electrically connect the SMT components. A flexible bipartite encapsulation housing encases therein the FPCB, the SMT components and the stretchable interconnects. The encapsulation housing includes top and bottom housings halves that are fabricated, e.g., separately from the FPCB, SMT components and stretchable interconnects, and then adhered together. The top encapsulation housing half has first prefabricated recessed regions for seating therein the SMT components and the stretchable interconnects, while the bottom encapsulation housing half has second prefabricated recessed regions for seating therein the FPCB.

Other aspects of the present disclosure are directed to methods for making and methods for using flexible integrated circuits. In one aspect, a method for encapsulating a conformal electronic device is disclosed. The method includes: molding a top flexible encapsulation housing component; molding a bottom flexible encapsulation housing component; placing the bottom flexible encapsulation housing component into an assembly fixture; dispensing a first shot/layer of adhesive onto the bottom flexible encapsulation housing component; placing a flexible printed circuit board assembly (FPCBA) on top of the first shot/layer of adhesive and/or the bottom flexible encapsulation housing component in the assembly fixture; dispensing a second shot/layer of adhesive onto the FPCBA and/or the bottom flexible encapsulation housing component; and, placing the top flexible encapsulation housing component on top of the FPCBA and/or the second shot/layer of adhesive in the assembly fixture to create a stack and thereby encase the FPCBA between the top and bottom flexible encapsulation housing components.

The method may optionally include, singly or in any combination: applying pressure to the stack to thereby cure the adhesive at or near room temperature; performing a die cut on the stack; and/or priming portions of the FPCBA prior to dispensing the second shot/layer of adhesive. The FPCBA may comprise spaced device islands that are electrically connected via stretchable electrical interconnects. For this configuration, the top flexible encapsulation housing component comprises pockets and tracks for seating therein the device islands and the stretchable electrical interconnects, respectively. The top encapsulation housing component may also comprise a first recessed substrate region for seating therein at least a (top) portion of the flexible substrate, whereas the bottom encapsulation housing component may comprise a recessed substrate region for seating therein at least a (bottom) portion of the flexible substrate.

The above summary is not intended to represent every embodiment or every aspect of the present disclosure. Rather, the foregoing summary merely provides an exemplification of some of the novel aspects and features set forth herein. The above features and advantages, and other features and advantages of the present disclosure, which are considered to be inventive singly and in any combination, will be readily apparent from the following detailed description of representative embodiments and modes for carrying out the present invention when taken in connection with the accompanying drawings and the appended claims.

BRIEF DESCRIPTION OF THE DRAWINGS

FIGS. 6A and 6B are top-view and bottom-view illustrations, respectively, of a conformal electronics device with a multi-part encapsulation housing having projections in accord with aspects of the present disclosure.

Figure 1:
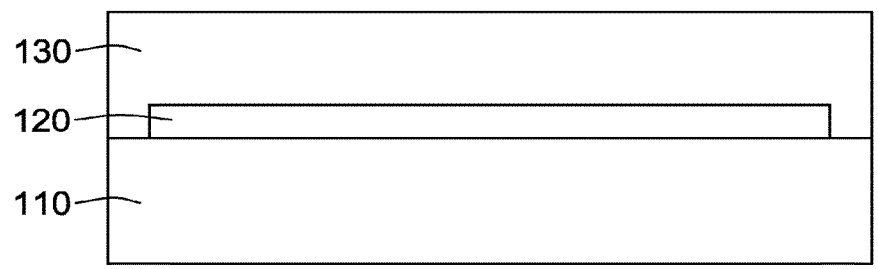
FIG. 1 is a side-view illustration of an example of a conformal electronics device with an encapsulation layer in accord with aspects of the present disclosure.

The present disclosure is susceptible to various modifications and alternative forms, and some representative embodiments have been shown by way of example in the drawings and will be described in detail herein. It should be understood, however, that the inventive aspects are not limited to the particular forms illustrated in the drawings. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

This disclosure is susceptible of embodiment in many different forms. There are shown in the drawings, and will herein be described in detail, representative embodiments with the understanding that the present disclosure is to be considered as an exemplification of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise. For purposes of the present detailed description, unless specifically disclaimed or logically prohibited: the singular includes the plural and vice versa; and the words "including" or "comprising" or "having" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

It should be understood that any and all combinations of the features, functions and concepts discussed in detail herein are contemplated as being part of the inventive subject matter (provided such concepts are not mutually inconsistent). For example, although differing in appearance, the individual systems and devices and functional componentry depicted and discussed herein can each take on any of the various forms, optional configurations, and functional alternatives described above and below with respect to the other disclosed embodiments, unless explicitly disclaimed or otherwise logically prohibited. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

With respect to components, substrates, layers or other surfaces described in the Detailed Description in connection with various examples of the principles herein, any spatial references to "top" and "bottom" are used primarily to indicate relative position, alignment, and/or orientation of these components, layers, etc., with respect to each one another. These terms do not necessarily restrict to a particular frame of reference (e.g., a gravitational frame of reference) unless explicitly stated. Thus, reference to a "bottom" of a component, substrate, or a layer does not necessarily require that the indicated component, substrate, or layer be facing a ground surface. Similarly, other terms of spatial reference, such as "over," "under," "above," "beneath," and the like, do not necessarily restrict to a particular frame of reference, such as a gravitational frame of reference, but rather are used primarily to indicate relative position, alignment and/or orientation of various elements/components with respect to the substrate (or other surface) and each other. Moreover, use of the terms "disposed on" and "disposed over" in the Detailed Description encompass the meaning of "embedded in" and "partially embedded in," and vice versa. In addition, reference to feature A being "disposed on," "disposed between," or "disposed over" feature B in the Detailed Description encompasses examples where feature A is in contact with feature B, as well as examples where other layers and/or other components are positioned between feature A and feature B.

The terms "flexible" and "stretchable" and "bendable," including roots and derivatives thereof, when used as an adjective to modify electrical circuitry, electrical systems, and electrical devices or apparatuses, are meant to encompass electronics that comprise at least some components having pliant or elastic properties such that the circuit is capable of being flexed, stretched and/or bent, respectively, without tearing or breaking or compromising their electrical characteristics. These terms are also meant to encompass circuitry having components (whether or not the components themselves are individually stretchable, flexible or bendable) that are configured in such a way so as to accommodate and remain functional when applied to a stretchable, bendable, inflatable, or otherwise pliant surface. In configurations deemed "extremely stretchable," the circuitry is capable of stretching and/or compressing and/or bending while withstanding high translational strains, such as in the range of −100% to 100%, −1000% to 1000%, and, in some embodiments, up to −100,000% to +100,000%, and/or high rotational strains, such as to an extent of 180° or greater, without fracturing or breaking and while substantially maintaining electrical performance found in an unstrained state.

Encapsulated discrete "islands" mentioned herein are discrete operative devices arranged in a "device island" arrangement, and are themselves capable of performing a functionality described herein, or portions thereof. Such functionality of the operative devices can include, for example, integrated circuits, physical sensors (e.g. temperature, pH, light, radiation, etc.), biological sensors, chemical sensors, amplifiers, A/D and D/A converters, optical collectors, electro-mechanical transducers, piezoelectric actuators, light emitting electronics (e.g., LEDs), and any combination thereof. A purpose and an advantage of using one or more standard ICs (e.g., CMOS on single crystal silicon) is to use high-quality, high-performance, and high-functioning circuit components that are readily accessible and mass-produced with well-known processes, and which provide a range of functionality and generation of data far superior to that produced by passive means. The discrete islands may range from about, but not limited to, 10-100 micrometers (μm) in size measured on an edge or by diameter.

Examples described herein generally relate to systems and methods for encapsulating conformal electronics technology such as, for example, conformal sensors for sensing, measuring, or otherwise quantifying motion, including motion and/or muscle activity of at least one body part. In some examples, such conformal sensors can be configured to detect and/or quantify motion of a body part or other object. Such methods can help to increase the durability, comfort, and/or aesthetic appeal of the conformal electronic devices described herein, as well provide, for example, versatility, cost and scale-up capability.

According to at least some of the representative systems, methods, and apparatuses described herein, the example conformal sensors provide conformal sensing capabilities, providing mechanically transparent close contact with a surface (such as the skin or other portion of the body or the surface of an object) to improve measurement and/or analysis of physiological information of the body or other information associated with the object. Conformal sensors of the example systems, methods, and devices described herein can be formed as patches. These patches are flexible and stretchable, and can be formed from conformal electronics and conformal electrodes disposed in or on a flexible and/or stretchable substrate. In various examples, the conformal electrodes can be formed integral with the conformal sensor, or can be made separable from the conformal sensor.

The example systems, methods and apparatuses described herein can be used with subjects that are humans or subjects that are non-human animals. The conformal sensors can be mounted to and caused to conform to, e.g., a portion of the skin or other portion of the body of the human or non-human animal, or the surface of an object.

Disclosed conformal sensor systems and devices can be used for sensing, measuring and/or otherwise quantifying at least one parameter associated with portions of the body or other object. In another example, the systems, methods, and apparatuses described herein can be configured to use the results of analysis of data indicative of at least one parameter associated with portions of the body or other object, for such applications as medical diagnosis, medical treatment, physical activity, sports, physical therapy and/or clinical purposes. Data gathered using at least some of the disclosed conformal sensors based on sensing the at least one parameter associated with portions of the body or other object, along with data gathered based on sensing other physiological measures of the body, can be analyzed to provide useful information related to medical diagnosis, medical treatment, physical state, physical activity, sports, physical therapy, and/or clinical purposes. When sensing is performed using thin, conformal, and wearable sensors described herein, or measurement devices with such sensors, these measures and metrics can be unimpeded by the size, weight or placement of the measurement devices.

Example systems, methods, and apparatuses described herein provide for creating, building, and deploying thin and conformal electronics that are useful in a wide variety of applications, both inside the body and outside the body. The example conformal sensors include silicon-based and other electronics in new form factors allowing the creation of very thin and conformal devices.

Example systems, methods, and apparatuses described herein including the conformal sensors can be configured to monitor the body motion and/or muscle activity, and to gather measured data values indicative of the monitoring. The monitoring can be performed in real-time, continuously, systematically, at different time intervals, and/or upon request. In addition, at least some of the systems, methods, and apparatuses described herein can be configured to store measured data values to a memory of the system and/or communicate (transmit) the measured data values to an external memory or other storage device, a network, and/or an off-board computing device. In any example herein, the external storage device can be a server, including a server in a data center. Non-limiting examples of computing devices applicable to any of the embodiments according to the principles herein include smartphones, tablets, laptops, slates, e-readers or other electronic reader or hand-held or worn computing device, an Xbox®, a Wii®, or other game system(s).

This example systems, methods, and apparatus can be used to provide ultra-thin and conformal electrodes that facilitate monitoring and diagnosis of subjects, including when combined with measurements of at least one parameter associated with portions of the body or other object. In combination with pharmaceuticals, this information can be used to monitor and/or determine subject issues, including compliance with and/or effects of treatment regimens.

The example conformal sensors can be configured to provide a variety of sensing modalities. Example conformal sensors can be configured with sub-systems such as telemetry, power, power management, processing as well as construction and materials. A wide variety of multi-modal sensing systems that share similar design and deployment can be fabricated based on the example conformal electronics.

According to aspects of the disclosed concepts, conformal sensors can be configured to include electronics for performing measurements of at least a parameter of an object or a body part that is proximate to the conformal sensor. An example conformal sensor system can include electronics for performing at least one of an accelerometry measurements and a muscle activation measurement. In other examples, the conformal sensor system can include electronics for performing at least one other measurement, such as but not limited to heart rate measurements, electrical activity measurements, temperature measurements, hydration level measurements, neural activity measurements, conductance measurements, environmental measurements, and/or pressure measurements. For example, the conformal sensors can be configured to perform any combination of two or more of these different types of measurements.

Referring now to the drawings, wherein like reference numerals refer to like components throughout the several views, FIG. 1 illustrates a conformal electronics device, designated generally at 100, which includes a substrate 110, electronic circuitry 120, and an encapsulation layer 130. Conformal electronics device 100, for some implementations, is configured to provide conformal sensing and/or monitoring capabilities. The device 100 can provide mechanically transparent close contact with a surface (e.g., the skin or other portion of the body or the surface of an object) to improve measurement and/or analysis of physiological information of the body or other information associated with the object.

The substrate 110 can, for example, be a soft, flexible, or otherwise stretchable substrate of electrically non-conductive material that can conform to the contour of a surface on which the conformal electronics device 100 is disposed. Examples of such surfaces include, but are not limited to, a body part of a human or an animal or a portion of an object. Suitable substrates 110 that can be used in the conformal electronics device 100 include, for example, a polymer or a polymeric material. Non-limiting examples of applicable polymers or polymeric materials include, but are not limited to, a polyimide (PI), a polyethylene terephthalate (PET), a silicone, or a polyurethane. Other non-limiting examples of applicable polymers or polymeric materials include plastics (including a thermoplastic, a thermoset plastic, or a biodegradable plastic), elastomers (including a thermoplastic elastomer, a thermoset elastomer, or a biodegradable elastomer), and fabrics (including a natural fabric or a synthetic fabric), such as but not limited to acrylates, acetal polymers, cellulosic polymers, fluoropolymers, nylons, polyacrylonitrile polymers, polyarylates, polybenzimidazole, polybutylene, polycarbonate, polyesters, polyetherimide, polyethylenes, polyketones, polymethylpentene, polyphenylenes, polyphthalamide, polypropylene, polyurethanes, resins, or any combinations of these materials.

The substrate 110 can be formed using any suitable process including, for example, casting, molding, stamping, or any other suitable process. Furthermore, the substrate 110 can include other features, for example, holes, protrusions, grooves, indents, non-conducting interconnects, or any other features. In some examples, grooves, which can act as seats for device islands or interconnects, can be formed on the substrate 110.

Electronic circuitry 120 can be any suitable electronic circuitry that is operable, for example, to provide sensing, detecting, or otherwise quantifying at least one parameter associated with a subject or a surface (e.g., an animal or human body part or other object) on which the conformal electronics device 100 is disposed. For instance, the electronic circuitry 120 is configured to measure, detect, sense, or otherwise quantify motion, muscle activity, temperature (e.g., body temperature), pulse, moisture, pressure, and the like. The electronic circuitry 120 can include one or more sensor system(s), and one or more other component(s) (e.g., interconnects). The one or more sensor systems and one or more other component(s) are disposed on one or more device islands. The one or more device islands are arranged in a spatial configuration based on the desired dimensions and conformability of the overall resulting conformal electronic devices.

The one or more sensor systems included in the electronic circuitry 120 can include at least one component to perform at least one sensor measurement. Non-limiting examples of sensor measurement include an accelerometry measurement, a muscle activation measurement, a heart rate measurement, an electrical activity measurement, a temperature measurement, a hydration level measurement, a neural activity measurement, a conductance measurement, an environmental measurement, and/or a pressure measurement. As examples, the sensor systems can include an accelerometer (such as but not limited to a single-axis accelerometer or a 3-axis accelerometer), a gyroscope (such as but not limited to a 3-axis gyroscope), a nerve conduction study (NCS) component, an electromyography (EMG) component, an electroencephalogram (EEG) component, and/or an electrocardiogram (ECG) component.

Non-limiting examples of other components that can be included in the electronic circuitry 120 include at least one battery, a regulator, a processing unit, a memory (such as but not limited to a read-only memory, a flash memory, and/or a random-access memory), an input interface, an output interface, a communication module, a passive circuit component, an active circuit component, etc. In an example, the conformal electronics device 100 comprises at least one microcontroller and/or other integrated circuit component. In an example, the electronic circuitry 120 includes at least one coil, such as but not limited to a near-field communication (NFC) enabled coil. In another example, the electronic circuitry 120 includes a radio-frequency identification (RFID) component. In the same regard, the electronic circuitry 120 can include a dynamic NFC/RFID tag integrated circuit with a dual-interface, electrically erasable programmable memory (EEPROM).

The configuration of the device islands can be determined based on, e.g., the type of components that are incorporated in the overall electronic circuitry 120 (including the sensor system), the intended dimensions of the overall conformal electronics device 100, and the intended degree of conformability of the overall conformal electronics device 100. As a non-limiting example, the configuration of one or more device islands can be determined based on the type of overall conformal electronics device 100 to be constructed. For instance, the overall conformal electronics device 100 may be a wearable conformal electronics structure, or a passive or active electronic structure that is to be disposed in a flexible and/or stretchable object (including an inflatable or expandable surface of an interventional catheter). Optionally, the configuration of the device island(s) can be determined based on the components to be used in an intended application of the overall conformal electronics device 100. Example applications include a motion sensor, a temperature sensor, a neuro-sensor, a hydration sensor, a heart sensor, a flow sensor, a pressure sensor, an equipment monitor (e.g., smart equipment), a respiratory rhythm monitor, a skin conductance monitor, an electrical contact, or any combination thereof. One or more device islands can be configured to include at least one multifunctional sensor, including a temperature, strain, and/or electrophysiological sensor, a combined motion-/heart/neuro-sensor, a combined heart-/temperature-sensor, etc.

The encapsulation layer 130 is disposed on at least a portion of the electronic circuitry 120 and at least a portion of the substrate 110 such that the encapsulation layer 130 envelops at least a portion of the electronic circuitry 120. In some configurations, such as that shown, encapsulation layer 130 is formed of a material that hermetically seals portions (e.g., surfaces) of the electronic circuitry 120 exposed by the substrate 110. Optionally, the encapsulation layer 130 can act as an "encapsulation housing" by enveloping most or all of the conformal electronics device 100. For some implementations, the encapsulation layer 130 is disposed on the device islands and interconnects of the electronic circuitry 120 hermetically sealing the device islands and interconnects. In such instances, the encapsulation layer 130 can include holes, apertures, or otherwise openings such that one or more sensors included in the electronic circuitry 120 are exposed (e.g., to contact a skin or body part of an animal or human, or any other object). Hermetically sealing at least a portion of the electronic circuitry 120 by the encapsulation layer 130 can help to protect the components of the electronic circuitry 120 from corrosive factors, including damage from corrosive chemicals, dust, moisture, oxidation, etc.

Encapsulation layer 130 of FIG. 1 can be formed from a soft, flexible, and electrically non-conductive material. In some examples, the encapsulation layer 130 is formed from the same material as the substrate 110. In other examples, a different material can be used to form the encapsulation layer 130. Suitable materials that can be used in the encapsulation layer 130 include, for example, a polymer or a polymeric material. Non-limiting examples of applicable polymers or polymeric materials include, but are not limited to, a polyimide (PI), a polyethylene terephthalate (PET), a silicone, or a polyurethane. Other non-limiting examples of applicable polymers or polymeric materials include plastics (including a thermoplastic, a thermoset plastic, or a biodegradable plastic), elastomers (including a thermoplastic elastomer, a thermoset elastomer, or a biodegradable elastomer), and fabrics (including a natural fabric or a synthetic fabric), such as but not limited to acrylates, acetal polymers, cellulosic polymers, fluoropolymers, nylons, polyacrylonitrile polymers, polyamide-imide polymers, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials. In an example, the polymer or polymeric material can be a UV curable polymer, such as a ultraviolet (UV) curable silicone.

With continuing reference to FIG. 1, the encapsulation layer 130 can be formed using any suitable process, for example, casting, molding, stamping, or any other known or hereinafter developed fabrication methods. Furthermore, the encapsulation layer 130 can include a variety of optional features, such as holes, protrusions, grooves, indents, non-conducting interconnects, or any other features. By way of non-limiting example, encapsulation layer 130 can be formed using an overmolding process. In general, overmolding allows for a previously fabricated part to be inserted into a mould cavity an injection molding machine that forms a new plastic part, section, or layer on or around the first part. One such overmolding process includes directly casting a liquid material capable of forming the encapsulation layer 130 on the electronic circuitry 120 disposed on the substrate 110. The liquid material can then be cured, for example, by cooling and solidifying. Curing can be performed under any suitable conditions, for example, by applying pressure on the casted liquid material, heating the substrate, and/or applying a vacuum.

As another example, the electronic circuitry 120 can be embedded in the encapsulation layer 130 using a lamination process. For instance, the encapsulation layer 130 can be pre-casted into a sheet. A liquid adhesive (e.g., the uncured liquid material used to form the encapsulation layer, or any other suitable adhesive) can then be disposed on the electronic circuitry 120 and the substrate 110. The encapsulation layer 130 can be then disposed on the adhesive and pressure applied to squeeze out excess adhesive. The adhesive can then be cured to fixedly couple the encapsulation layer 130 to at least a portion of the electronic circuitry 120 and the substrate 130, thereby forming conformal electronics device 100 of FIG. 1.

According to aspects of the disclosed concepts, an adhesive material can be used during construction of encapsulated conformal electronic devices. Further to the options discussed above, the uncured liquid silicones used in the example lamination process can act as a type of adhesive, and harden, e.g., via curing (through crosslinking) to bind surfaces. In other examples, the electronic device components, including the device islands and electrical interconnects, can be affixed to a pre-cured sheet using a pressure sensitive adhesive prior to overmolding. A non-limiting example of a pressure sensitive adhesive is a rubber-based adhesive. In an example, in the construction of a patch including a sensor component (such as a temperature sensor or an electromagnetic radiation sensor (such as a UV sensor)), a pressure sensitive silicone transfer adhesive or a liquid silicone adhesive can be applied to the pre-cured sheet. Any adhesive described herein may be a sprayable or a brushable adhesive for application to a surface. An adhesive can aid in holding the electronic components in a specified position and arrangement, including in an archipelago arrangement, relative to other components of the system, during a subsequent overmolding process.

Adhesive materials can be used as a part of the lamination process during construction of an example device herein. For example, the electronic device components, including the device islands and/or the interconnects, can be affixed to a pre-cured base layer silicone sheet using a pressure sensitive silicone adhesive prior to applying the top layer of silicone sheet, with an uncured liquid silicone used for lamination. In other examples, the lamination can also be completed using a pressure sensitive silicone adhesive to embed an ultrathin electronics device between silicone sheets. The lamination can be based on use of a film adhesive that does not require a curing process.

Encapsulation layer 130 and/or base substrate 110 of FIG. 1 can be configured to facilitate modulation of a stress or a strain that might be caused in a portion of the conformal electronics device 100, for example, due to stretching, bending, compressing, torsion, or other deformation. As an example, there can be a concentration of stress and/or strain at a transition from a more rigid portion of a system (e.g., a device island) to a more compliant structure (e.g., a flexible and/or stretchable component) when the conformal electronics device 100 is subjected to a deformation. Other areas of stress concentration can include, for example, edges of interconnects, or boundaries where an interconnect is coupled to a device island. Encapsulation layer 130 can be formed from a material that is configured to have a thickness and/or disposed locally on portions of the electronic circuitry 120 such as to minimize the stress on the components of the electronic circuitry 120 by adjusting the location of a neutral mechanical plane relative to a functional component of the electronic circuitry. For example, the material used to form the encapsulation layer 130 can be introduced locally in a region of a component of the electronic circuitry 120, such as proximate to the portion of the component of the electronic circuitry 120. The locally disposed encapsulation layer protects the component from applied stresses/strains in the event of a deformation force being applied to the overall conformal electronics device 100 by adjusting the location of the neutral mechanical plane locally in the region of the component. Controlled placement of the neutral mechanical plane relative to a functional component can result in little to no stress or strain being exerted in the region of the component, when the conformal electronics device 100 is subjected to a deformation force.

In the embodiment illustrated in FIG. 1, the encapsulation layer 130 and/or substrate 110 can have an ultrathin thickness and have favorable mechanical and optical properties. Optionally, the encapsulation layer 130 can have a thickness in the range of about 0.05 mm to about 0.5 mm. Moreover, the encapsulation layer 130 and/or the substrate 110 can have an elongation in the range of about 200% to about 800% or, for some configurations, at least about 300%, at least about 400%, at least about 500%, at least about 600%, or at least about 700%, relative to the undeformed length of the encapsulation layer 130/substrate 110. In some examples, the encapsulation layer 130 and/or the substrate 110 have a tear strength of about 40 pounds per inch (ppi) to about 200 ppi or, for some configurations, at least about 60 ppi, at least about 80 ppi, at least about 100 ppi, at least about 120 ppi, at least about 140 ppi, at least about 160 ppi, or at least about 180 ppi. As another option, the encapsulation layer 130 and/or the substrate 110 can have a hardness measured by a durometer of about 10 A (e.g., according to the Shore A Hardness Scale) to about 60 A to higher, for example, about 20 A or at least about 20 A, about 30 A or at least about 30 A, about 40 A or at least about 40 A, about 50 A or at least about 50 A or about 60 A or at least about 60 A. For some configurations, the encapsulation layer 130 and/or the substrate 110 can have an optical transparency of greater than about 90% between wavelengths of light about 350 nm to about 1,000 nm. The total thickness of encapsulated conformal electronics device 100 (e.g., at its thickest point) can be in the range of about 0.20 mm to about 1.0 mm. For some configurations, the encapsulation layer 130 and/or the substrate 110 can be transparent.

Figure 2:
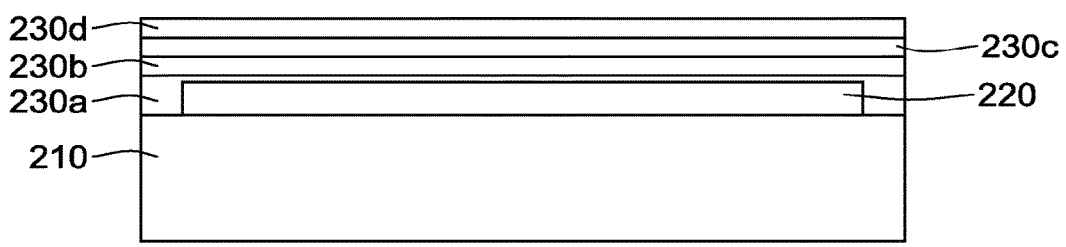
FIG. 2 is a side-view illustration of an example of a conformal electronics device with multiple encapsulation layers in accord with aspects of the present disclosure.

Referring next to FIG. 2, a representative encapsulated conformal electronics device is shown in accordance with aspects of the present disclosure. Similar to the device architecture presented in FIG. 1, conformal electronics device 200 of FIG. 2 includes, as some non-limiting examples, electronic circuitry 220 that is coupled to a substrate 210. The substrate 210 and the electronic circuitry 220 can be substantially similar to the substrate 110 and the electronic circuitry 120, respectively, described with respect to the conformal electronics device 100. For example, the substrate 210 and the electronic circuitry 220 can each take on any of the various forms, optional configurations, and functional alternatives described above with respect to the corresponding structure illustrated in FIG. 1.

A series of encapsulation layers—first, second, third and fourth encapsulation layers 230a, 230b, 230c and 240d, respectively (collectively referred to as "encapsulation layers") in FIG. 2—are disposed sequentially on the substrate 210 and circuitry 220, with the top three layers 230b-d operating to strengthen the first encapsulation layer 230a. Each encapsulation layer 230a-d can be an ultrathin layer, for example, having a thickness in the range of about 0.05 mm to about 0.5 mm. The encapsulation layers 230a-d of FIG. 2 can be formed from any of the materials described above with respect to conformal electronics device 100 of FIG. 1. While shown as having four encapsulation layers 230a-d, any number of encapsulation layers can be used to encapsulate the device 200. Moreover, while FIG. 2 shows each of the encapsulation layers covering the entire width of the device 200, in some examples, one or more of the various encapsulation layers 230a-d can be disposed on only a portion of the electronic circuitry 220 and/or the substrate 210. For example, one or more of the plurality of encapsulation layers 230a-d can be disposed in proximity to an area of stress/strain concentration (e.g., a device island or edges of interconnects), thereby adjusting the location of a neutral mechanical plane relative to a functional component of the electronic circuitry.

The example systems, methods and apparatus according to the principles described herein provide methods for encapsulating relatively fragile conformal electronics, such as a flexible printed circuit board assembly (FPCBA), to generate more robust devices that are protected from mechanical and/or environmental damage. Example systems, methods and devices according to the principles described herein can provide an encapsulation housing that can be molded or otherwise generated separately from the conformal electronic device. The encapsulation housing can be molded or otherwise generated as a single unit that is disposed about portions of an example conformal electronic device. The example encapsulation housing can be molded or otherwise generated in two or more separate housing components which can be coupled, assembled, or otherwise combined with an example conformal electronics device to provide an encapsulated conformal electronics device.

In an example where the encapsulation housing is formed as a single encapsulation housing unit, the housing unit can be formed with an opening and/or a pocket into which the conformal electronic device can be inserted or otherwise disposed. Portions of this single encapsulation housing unit can be formed with recessed or projecting features. The example recessed features (also referred to herein as "complementary depression") and protruding features (also referred to herein as "projections") can mate with features, such as (but not limited to) cut outs, components, and peripheral design features built into the conformal electronic devices, to allow for self-aligning, interlocking and locating features that aid in the assembly process. The example recessed features and protruding features also can aid in the construction and/or structural integrity of the encapsulated conformal electronic device.

Figure 3A:
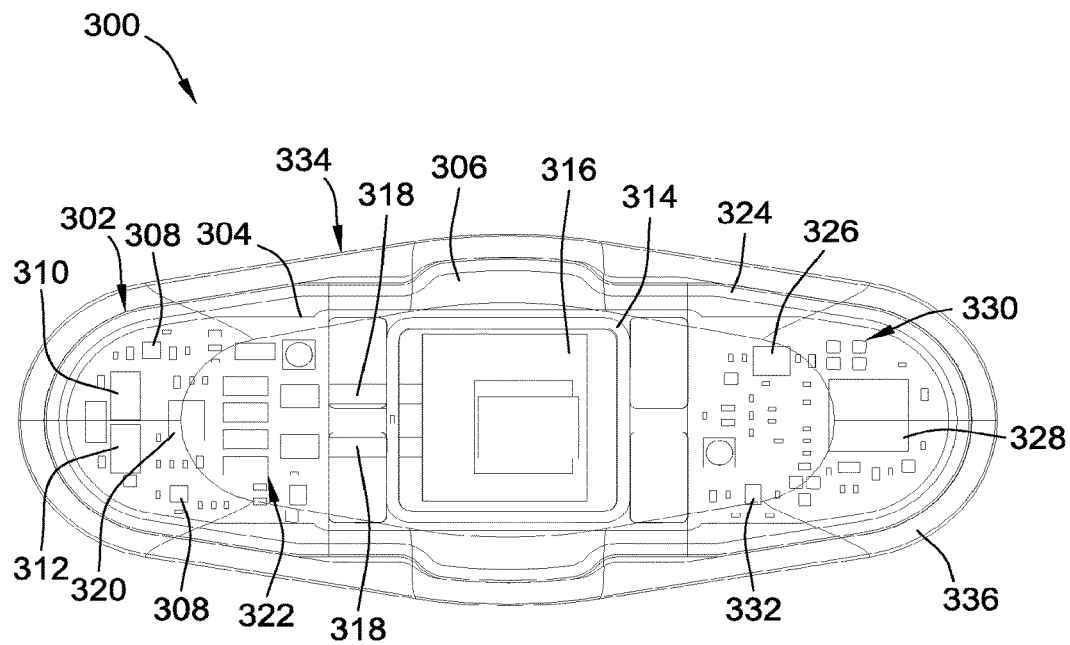
FIGS. 3A and 3B are top-view and bottom-view illustrations, respectively, of a conformal electronics device with a multi-part encapsulation housing in accord with aspects of the present disclosure.
Figure 3B:
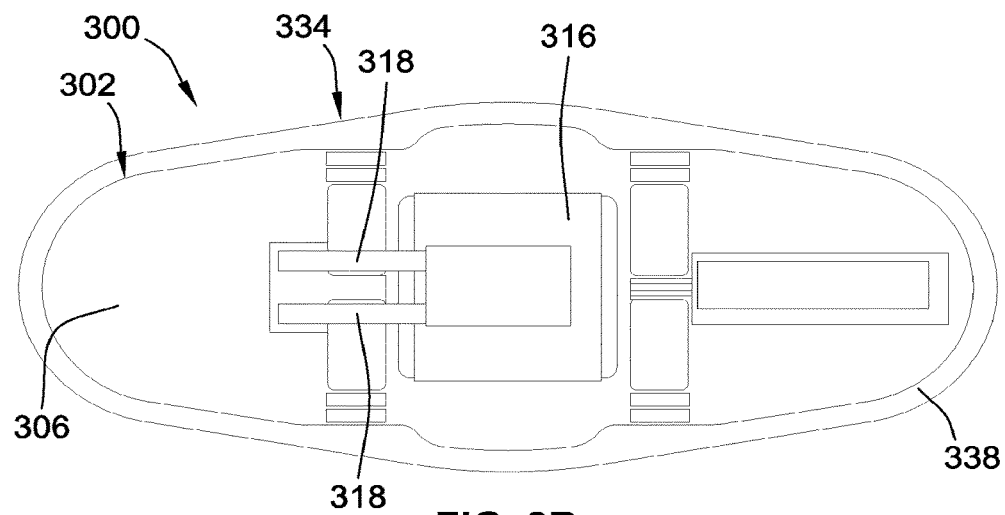

FIGS. 3A and 3B present top-view and bottom-view illustrations, respectively, of a conformal electronics device with a multi-part encapsulation housing, collectively designated as a conformal integrated circuit (IC) device or an encapsulated conformal electronics device 300. Although differing in appearance, the encapsulated conformal electronics device 300 may include any of the features, options, and alternatives described herein with respect to the other encapsulated devices, and vice versa, unless otherwise disclaimed or logically prohibited. The device 300 includes a flexible printed circuit board assembly (FPCBA) 302 comprising a flexible printed circuit board (FPCB) 304 with a flexible substrate 306. Electronic circuitry, which may be in the nature of surface-mount technology (SMT) components configured as integrated circuit (IC) device islands, is mounted or otherwise attached to the flexible substrate 306. By way of non-limiting example, a pair of IC amplifiers 308, a UV A sensor 310 and a UV B sensor 312 are shown mounted to the substrate 306 on the left-hand side of the FPCB 304 in FIG. 3A. A BLUETOOTH® Low Energy Antenna 314 is shown circumscribing a power source (e.g., a 2 mAhr LiPo battery) 316 at the center of the substrate 306. Stretchable interconnects (two of which are identified at 318 in FIGS. 3A and 3B) electrically connect two or more of the IC devices. One or more of the devices may also be electrically connected by conductive tracks, e.g., etched in any conventional or hereinafter developed method into substrate 306. An IC power management/battery charging control device 320 is operatively connected to an array of power storage cells (e.g., capacitors) 322 for BLUETOOTH® low energy communication. In this regard, an alternating current (AC) coil 324, which provides wireless charging capabilities, traverses the outer periphery of the FPCB 304. FPCBA 302 also includes an oscillator 326 for a system on chip BLUETOOTH® device, including system on chip BLUETOOTH® Low Energy IC 328. Encapsulated conformal electronics device 300 is also provided with interface points 330 for programming and test; while not all identified with reference numerals, there are 11 total interface points on FPCB 304 of FIG. 3A. A power switch 332, which is part of the power management system, is also provided.

The encapsulated conformal electronics device 300 is fabricated with a flexible multi-part encapsulation housing 334 that substantially or completely encases therein the electronic circuitry and flexible substrate of the FPCBA 302. For at least some embodiments, flexible multi-part encapsulation housing 334 is designed, for example, to hermetically seal the flexible substrate and electronic circuitry. As shown, the multi-part encapsulation housing 334 is a bipartite construction comprising first and second encapsulation housing components 336 and 338, respectively. It is contemplated, however, that the encapsulation housing 334 comprise greater or fewer than the two housing components illustrated in the figures. As explained in further detail below, the first (top) encapsulation housing component 336 is attached, e.g., via pressure sensitive adhesive, to the second (bottom) encapsulation housing component 338. Depending, for example, on the intended application of the device 300, encapsulation housing 334 may exhibit a durometer hardness rating of 20 Shore A and a tear strength of at least about 80 pounds per inch (ppi).

Figure 4A:
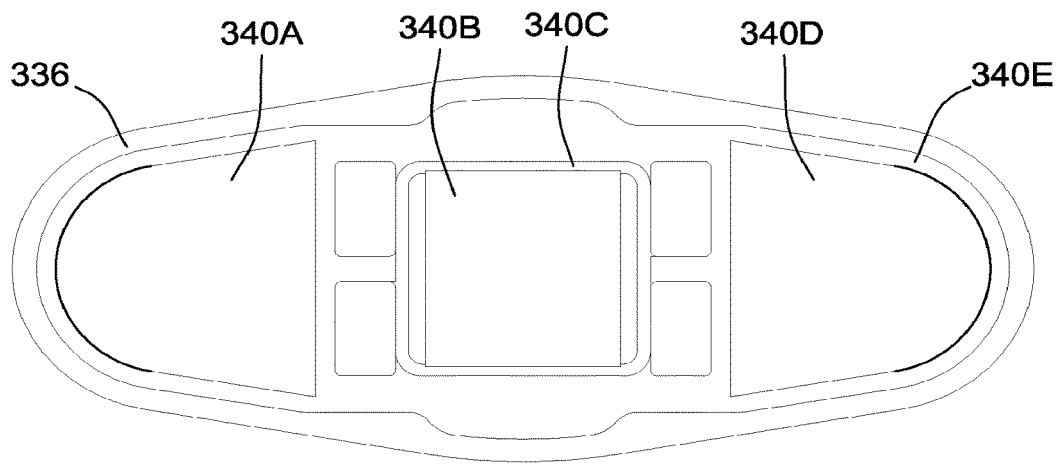
FIGS. 4A and 4B are an underside-view illustration of the first (top) encapsulation housing component and a plan-view illustration of the second (bottom) encapsulation housing component, respectively, of FIGS. 3A and 3B.
Figure 4B:
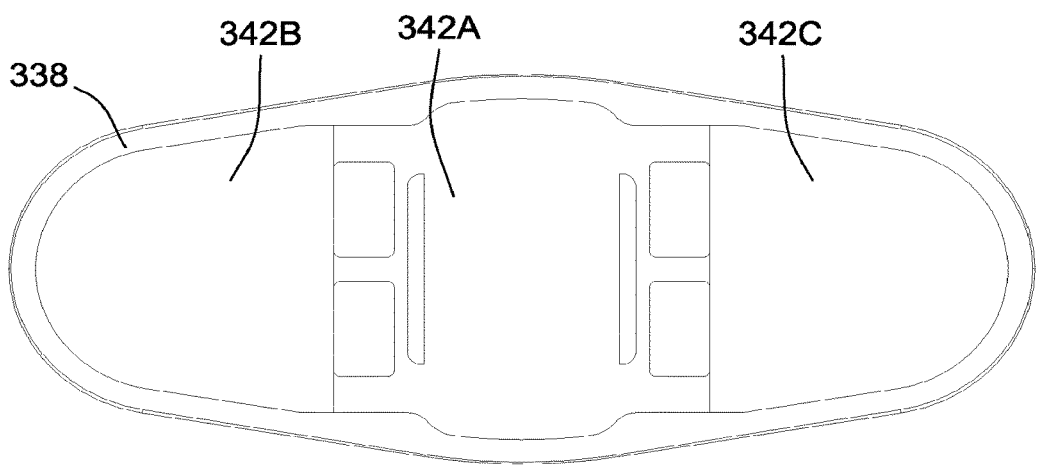

Turning next to FIGS. 4A and 4B, first housing component 336 is fabricated with one or more (first) recessed regions for seating therein the electronic circuitry and the flexible substrate of the FPCBA 302. For instance, top housing component 336 includes a plurality of prefabricated recessed pockets 340A-340D for seating therein the SMT components and electrical interconnects. For example, first recessed pocket 340A nests therein the IC amplifiers 308, UV A and UV B sensors 310, 312, charging control device 320 and power storage cells 322 of the FPCB 304. By comparison, second recessed pocket 340B is configured to nest therein the battery 316 while third recessed pocket 340C is configured to nest therein antenna coil 314. Seated inside the fourth recessed pocket 340D are oscillator 326, BLUETOOTH® Low Energy IC 328, eight of the interface points 330, and power switch 332. The (first) recessed regions of the first encapsulation housing component 336 may also comprise at least one recessed substrate region 340E for seating therein the flexible substrate 306. In this regard, second encapsulation housing component 338 is fabricated with one or more (second) recessed regions for seating therein at least a portion of the flexible substrate and at least some of the electronic circuitry of FPCBA 302. As shown, bottom housing component 338 includes a prefabricated recessed pocket 342A for seating therein battery 316 and interconnects 318, and a pair of laterally spaced, prefabricated recessed pocket 342B and 342C for seating therein the bottom of the flexible substrate 306. The encapsulated conformal electronic device 300 can include additional or fewer recessed regions, each of which may comprise greater or fewer prefabricated recessed pockets of similar or different configurations from that shown in the drawings. What's more, the number, types and arrangement of IC devices in each pocket may also be varied.

Figure 5A:
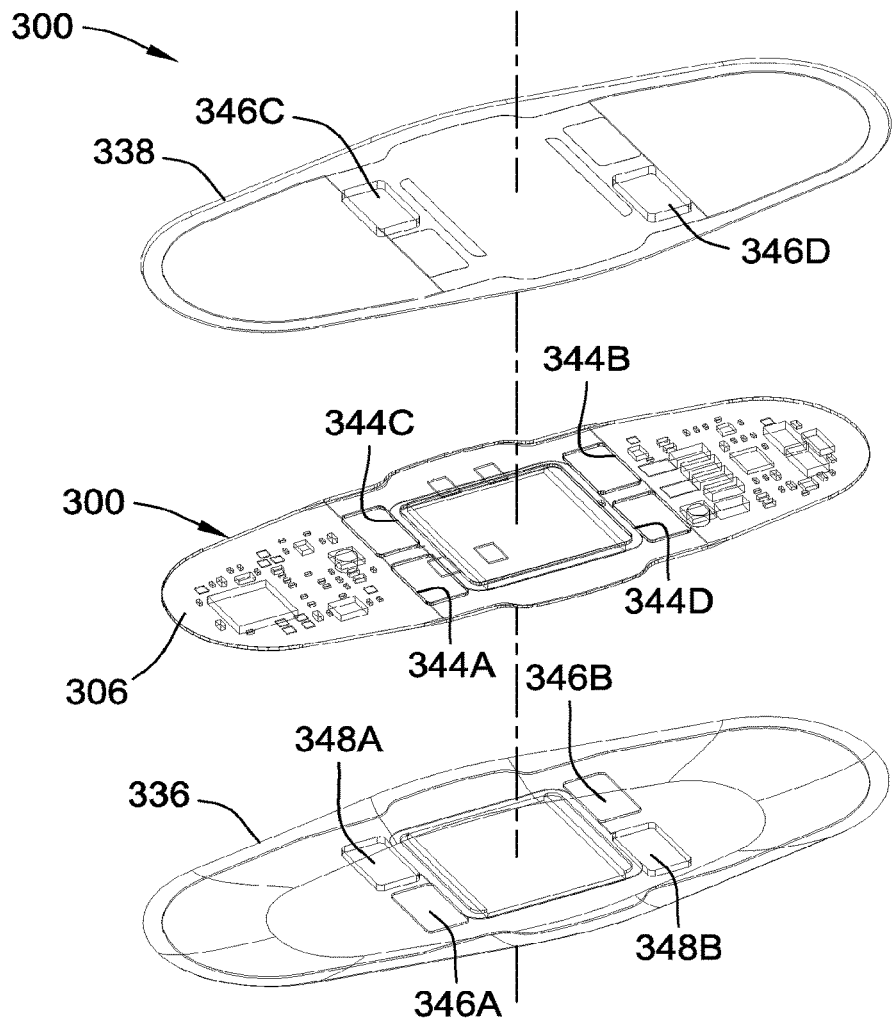
FIGS. 5A and 5B are partially exploded perspective-view and side-view illustrations, respectively, of the conformal electronics device and multi-part encapsulation housing of FIGS. 3A and 3B.

As seen in FIG. 5A, the flexible substrate 306 of FPCB 304 has an assortment of cut outs or apertures, represented herein by four through holes 344A-344D, on opposing sides of the battery 316, which help to position and attach the FPCBA 302 during assembly of the device 300. First encapsulation housing component 336 has at least one or, in some configurations, a pair of (first) projections 346A and 346B, each of which passes into a respective one of the substrate apertures—e.g., first and second through holes 344A and 344B—to thereby align and interlock the top encapsulation housing component 336 with the FPCBA 302. Likewise, second encapsulation housing component 338 has at least one or, in some configurations, a pair of (second) projections 346C and 346D, each of which passes through a respective one of the substrate apertures—e.g., third and fourth through holes 344C and 344D—and engages a complementary aperture 348A and 348B, respectively, in the top housing component 336 to thereby align and interlock the first and second housing components 336, 338 with the flexible substrate 306 and the electronic circuitry of FPCBA 302. It should be understood that the number, location, and geometric configurations of the various through holes and projections can be varied from that shown in the drawings.

For at least some embodiments, the example device 300 is fabricated by sandwiching the conformal electronics device module 302 between the top-side and bottom-side (clear silicone) encapsulation housing components 336, 338. As indicated above, the example conformal electronics device module 302 is configured as a flexible printed circuit board assembly (FPCBA). In other examples, the conformal electronics device module can be configured as other types of flexible and/or stretchable electronic devices. In configurations where the encapsulation housing is formed as two or more encapsulation housing components, portions of separate encapsulation housing components can be configured to mate to form with one or more openings and/or pockets into which differing portions of the conformal electronic device can be inserted or otherwise disposed. As indicated above, portions of one or more of the encapsulation housing components can be formed with recessed features or protruding features. Recessed features or protruding features on the top encapsulation housing components and the bottom encapsulation housing components can be coupled with features of the example conformal electronic devices, such as but not limited to cut outs, components, and peripheral design features, to allow for self-aligning, interlocking and locating features that aid in the assembly process. The example recessed features and protruding features also can aid in the construction and/or structural integrity of the encapsulated conformal electronic device.

The example systems, methods and devices provide for encapsulation processes and design reliability that are scalable to an industrial process. The example systems, methods and devices according to the principles described herein provide encapsulated conformal electronic devices as patches formed in new and unique form factors and exhibiting greater degrees of conformability. The example systems, methods and devices facilitate faster, more cost-effective manufacture of encapsulated conformal electronic devices. The designs allow setting up manufacturing chains for new classes of electronic products.

Some existing processes for encapsulating devices can be harmful to more fragile temperature-sensitive or pressure-sensitive components of the structures. The examples encapsulation processes according to the principles described herein provide a balance between avoiding exposing thermally sensitive components included in the functional conformal electronics to temperatures beyond their thermal budgets. A lithium polymer battery included in a conformal electronic device, for instance, has a thermal budget of less than about 60° C. The example encapsulation processes according to the principles described herein allow for greater latitude in controlling the shape, molding, and behavior of the encapsulation of a conformal electronic device. The examples encapsulation processes herein allow for use of a broader range of materials, coloration, texturing, other industrial design elements for the encapsulation. An encapsulation process based on any of the methods described herein can be implemented to facilitate potentially higher manufacturing throughput and lower costs.

The example encapsulation processes according to the principles described herein can be scaled to provide cost effective manufacturing solutions and more robust reliable encapsulated conformal electronic devices. By way of example, the processes involved in molding electronics in silicone elastomer materials (which typically involve curing at elevated temperatures above room temperature up to temperatures above 200° C.) can be decoupled from the processes involved in fabricating the conformal electronic devices. More fragile components, such the batteries used in the conformal electronics device, which have a low thermal budget (e.g., less than about 60° C.), can be protected. For example, based on the lower thermal budget of the batteries, processing to fabricate the conformal electronic device is beneficially performed below 60° C. The example encapsulation processes according to the principles described herein can be cost-effective since the comparatively expensive pieces of equipment used for lower temperature molding may be avoided. With lower temperature molding operations, throughput may go down and costs may rise. Comparatively expensive pieces of equipment used for silicone molding can be operated at higher temperatures to increase throughput, given that the electronics fabrication is decoupled from the molding process.

Example encapsulation processes described herein provide novel approaches to encapsulating conformal electronic devices in silicone that would allow for a higher manufacturing throughput and lower cost. At least some of the example encapsulation housings afford greater flexibility in industrial processes, since an example encapsulation housing can be configured with unique industrial design features including texturing, curvilinear design, coloring, etc. Differing portions of the example encapsulation housing, such as but not limited to top housing component(s) and/or bottom housing component(s), can be molded independently of the fabrication of the conformal electronics. By way of non-limiting example, two or more of the encapsulation housing components could be molded using silicone at higher process temperatures, in line with industry norms, such as but not limited to liquid injection molding (LIM) of liquid silicone rubber (LSR). Differing portions of the encapsulation housing, such as the top housing component(s) and/or bottom housing component(s), can be configured with recessed and/or protruding features that are derived from the design of the conformal electronics and accommodate the topography of the conformal electronics. In an example implementation, the encapsulation housing can be configured to easily allow the conformal electronics to be seated between the two or more molded encapsulation housing components. In an example implementation, the encapsulation housing can be configured to facilitate alignment of the conformal electronics between the two or more molded encapsulation housing components.

Any of the disclosed encapsulation housing units and components can be formed, for example, from a soft, flexible, or otherwise stretchable and electrically non-conductive material that can conform to the contour of a surface on which the encapsulated conformal electronics device is to be disposed. Examples of such surfaces can include but are not limited to a body part of a human or an animal, or a surface of an object, such as an automobile or a baseball. Suitable candidate materials that can be used for forming the encapsulation housing unit or component(s) include, for example, a polymer or a polymeric material. Non-limiting examples of applicable polymers or polymeric materials include, but are not limited to, a silicone or a polyurethane. Other non-limiting examples of applicable materials include plastics (including a thermoplastic, a thermoset plastic, or a biodegradable plastic), elastomers (including a thermoplastic elastomer, a thermoset elastomer, or a biodegradable elastomer), and fabrics (including a natural fabric or a synthetic fabric), such as acrylates, acetal polymers, cellulosic polymers, fluoropolymers, nylons, polyacrylonitrile polymers, polyamide-imide polymers, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials. A polymer or polymeric material can be a UV curable polymer, such as a UV-curable silicone. Somewhat higher modulus (or stiffness) materials, such as a polyimide (PI) or a polyethylene terephthalate (PET), may be introduced into portions of the illustrated encapsulation housing units and/or components to facilitate positioning of the neutral mechanical plane at the desired locations of the encapsulated conformal electronic device according to the principles described herein.

The conformal electronic device 302 can be any suitable electronics circuitry that can be used to provide, for example, sensing, detecting, or otherwise quantifying at least one parameter associated with a surface (e.g., an animal or human body part or other object) on which the encapsulated conformal electronics device 300 is disposed. For example, the conformal electronic device can be configured to measure, detect, sense, or otherwise quantify motion, muscle activity, temperature (e.g., body temperature), pulse, moisture, pressure, or any other parameter. The conformal electronic device can include a one or more sensor system(s), and one or more other component(s) (e.g., interconnects). The one or more sensor systems and one or more other component(s) are disposed on one or more device islands. The one or more device islands can be arranged in any spatial configuration based on the desired dimensions and conformability of the overall resulting conformal electronic devices.

An example process flow for fabricating an encapsulated conformal electronics device based on use of molded encapsulation housing components is as follows. A top encapsulation housing component is molded. As indicated above, FIG. 4A shows the shape and dimensions of a non-limiting example of a top encapsulation housing half 336 that can be molded. Top encapsulation housing half 336 can be molded using liquid silicone rubber (LSR) materials in a liquid injection molding (LIM) process. FIG. 4B shows the shape and dimensions of a non-limiting example of a bottom encapsulation housing half 338 that can be molded. Bottom encapsulation housing half 338, like the top half 336, can be molded using LSR materials and a LIM process. An example conformal electronic device, such as FPCBA 302, can be disposed in a molding house or other lamination system for assembly between the housing components of FIGS. 4A and 4B. An applicable encapsulation and/or lamination process can be performed in the assembly process.

Figure 5B:
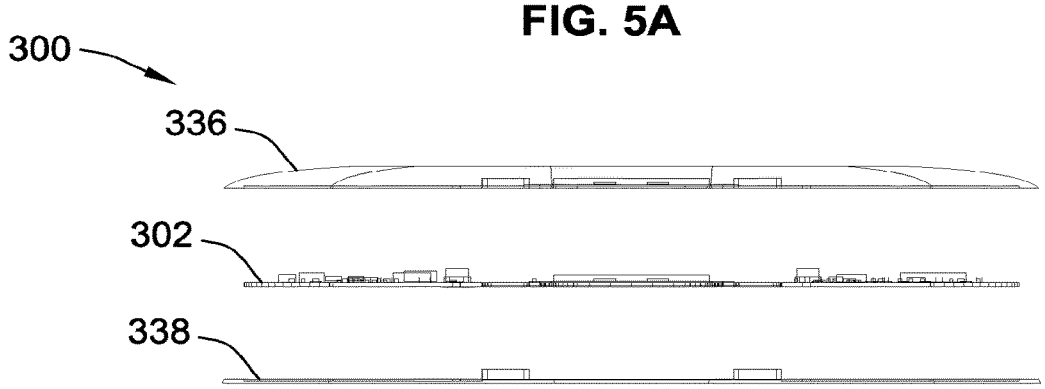
Figure 7A:
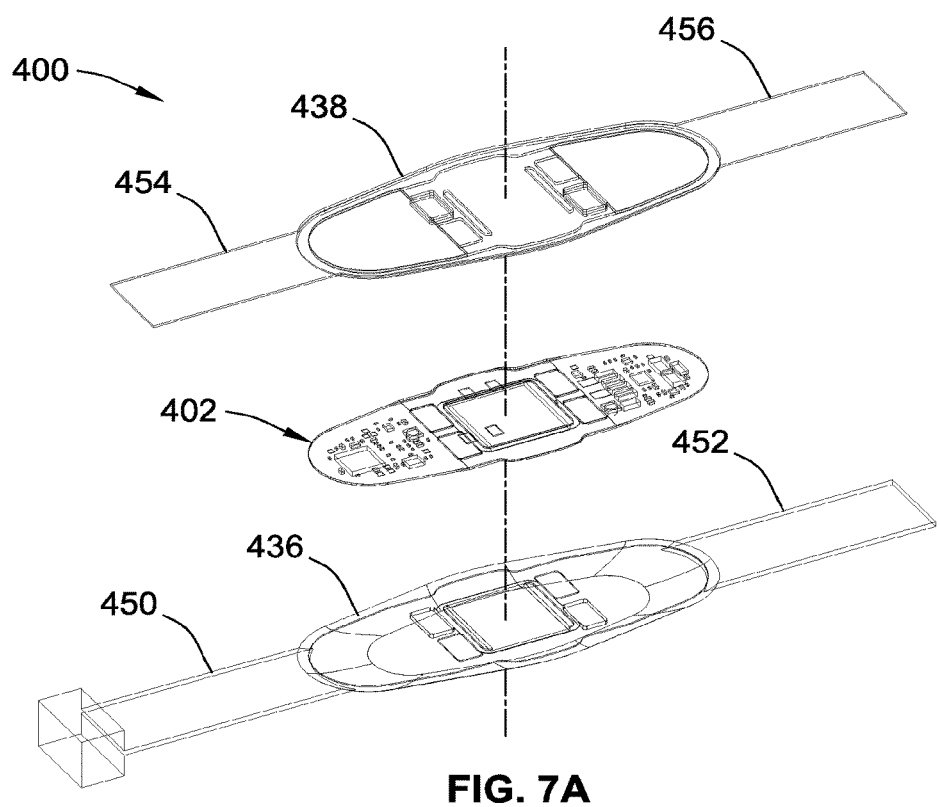
FIGS. 7A and 7B are partially exploded perspective-view and side-view illustrations, respectively, of the conformal electronics device and multi-part encapsulation housing of FIGS. 6A and 6B.
Figure 7B:
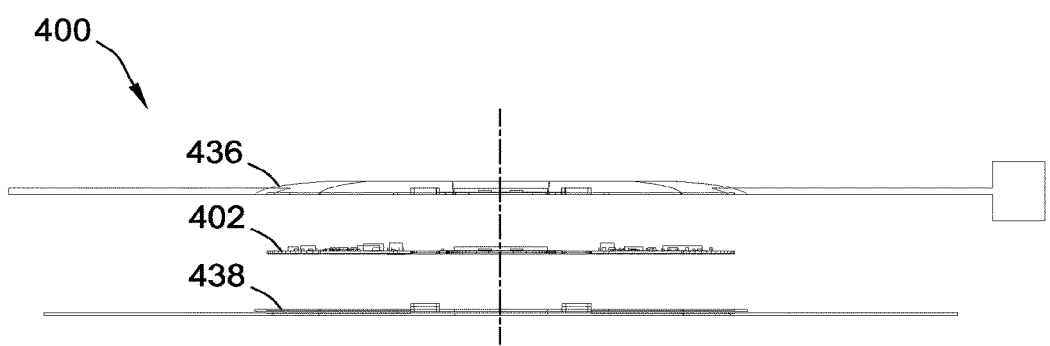

In any example implementation, the conformal electronic component can be coupled to and/or sandwiched between portions of the molded encapsulation housing components. FIGS. 5A and 5B show a non-limiting example assembly concept for coupling the conformal electronic device with the example encapsulation housing components of FIGS. 3A and 3B. FIGS. 7A and 7B show a non-limiting example assembly concept for coupling the conformal electronic device with the example encapsulation housing components of FIGS. 6A and 6B, including coupling the projections.

In the example of FIGS. 4A and 4B, candidate material characteristics for the encapsulation housing components include liquid silicone rubber-based materials, materials having a durometer of 20 A, and materials having a tear strength greater than about 80 ppi. The example encapsulation housing components can be formed using materials that are USP Class VI rated or better, such as but not limited to in applications where the encapsulated conformal electronic device is configured for biocompatibility in a skin-mounted system. In other examples, a wide range of elastomers and other types of polymers could be used to form the encapsulation housing components. The type of material used can be changed based on an example product industrial design and an example process flow to be implemented.

FIGS. 6A and 6B present top-view and bottom-view illustrations, respectively, of a conformal electronics device with a multi-part encapsulation housing, the conformal electronics device and encapsulation housing being collectively referenced as encapsulated conformal electronics device 400. While differing in appearance, the encapsulated conformal electronics device 400 may include any of the features, options, and alternatives described herein with respect to the encapsulated conformal electronics device 300. For example, the device 400 of FIG. 4A includes a flexible printed circuit board assembly (FPCBA) 402, which may be identical with, similar to, or distinct in construction from the FPCBA 302 of FIG. 3A. Encapsulated conformal electronics device 400 is fabricated with a flexible bipartite encapsulation housing 434 that substantially or completely encases therein the electronic circuitry and flexible substrate of the FPCBA 402. As shown, the encapsulation housing 434 of FIGS. 6A and 6B is a bipartite construction comprising a first (top) encapsulation housing component 436 attached, e.g., via pressure sensitive adhesive, to a second (bottom) encapsulation housing component 438.

In the illustrated example, the top and/or the bottom encapsulation housing components 436, 438 can be configured with one or more mounting projections. By way of non-limiting example, the top housing component 436 is provided with a pair of mounting projections, namely first and second elongated and generally flat straps 450 and 452, respectively, that project from opposing sides of the device 400. Likewise, bottom housing component 438 is provided with a pair of mounting projections, namely third and fourth elongated and generally flat straps 454 and 456, respectively, that project from opposing sides of the device 400. These representative mounting projections can be used, for example, to mechanically couple the encapsulated conformal electronic device 400 to a surface, such as a portion of a body part of a human. In other examples, the example projections can be used for electromechanical, environmental and other product based measurements.

For some example implementations, one or more inserts can be incorporated into a portion of the encapsulation housing unit or one or more of the encapsulation housing components. For example, an optical window or a filter (including a filter for electromagnetic radiation, microwaves, radio waves, etc.) can be included for an encapsulated electronic sensor (or detector) device or for an aesthetic purpose. As a non-limiting example, the encapsulated conformal electronic device could be configured as an electromagnetic radiation sensor, such as but not limited to an ultraviolet (UV) radiation sensor. An insert can be configured to exhibit the desired properties (such as but not limited to optical properties of a sensor region). Portions of the encapsulation housing can be configured, e.g., molded, to couple or otherwise conform to the shape of the insert. In an example, the encapsulated conformal electronic device could be configured as a conformal, body-interfacing patch. One or more device components can be disposed on, including being directly built into, a portion of the encapsulation housing, during or subsequent to the fabrication or molding process. Non-limiting examples of such device components include a microconnector, a mechanical housing, or an industrial design feature.

In an example implementation, an adhesive or multiple adhesives can be introduced at portions of the interfaces between the encapsulation housing components and the conformal electronic device. Candidate adhesive materials can be curable at or near room temperature, can be curable using pressures near about atmospheric pressure, and/or can be used to join portions of the housing components with sufficient bond strength to prevent separation. The candidate adhesive material also can be applied to the surfaces in a manner that can produce a substantially consistent bondline thickness on a three-dimensional surface. For example, the candidate adhesive material can facilitate bondline thickness in the range of 1-4 mils. Candidate adhesive materials can be USP Class VI rated or better. As non-limiting examples, candidate adhesive materials include silicone RTV, glues, acrylic adhesives, and pressure sensitive adhesives (PSA). This assembly process may also use custom fixtures and carriers. Some embodiments may use a double coat silicone/acrylic PSA adhesive.

Figure 8:
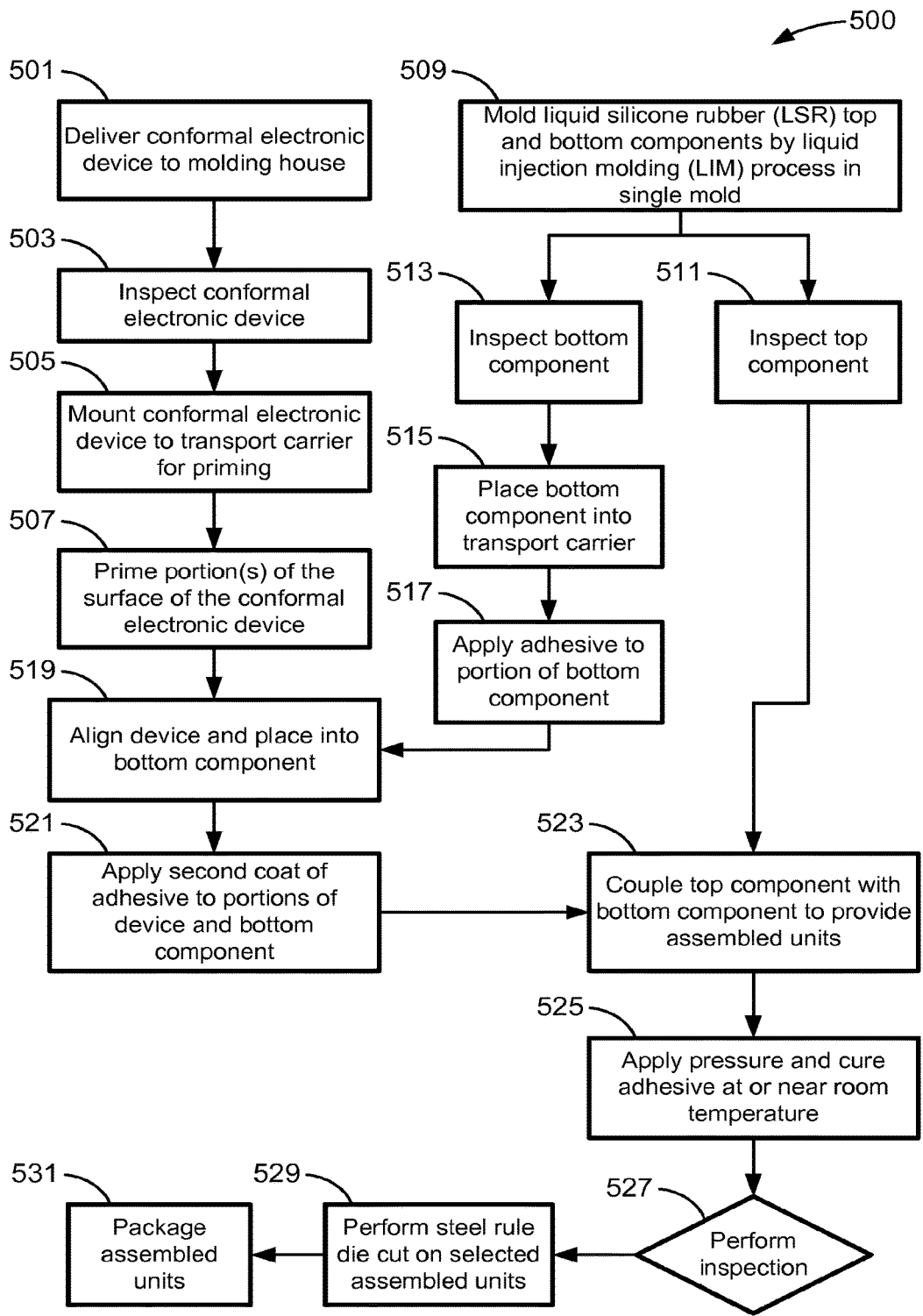
FIG. 8 is a process flowchart illustrating an exemplary method for encapsulating a conformal electronics device in accord with aspects of the present disclosure.

A representative process flow 801 for forming an encapsulated conformal electronic device, such as those illustrated in FIGS. 3A-3B and 4A-4B, is shown in FIG. 8. Blocks 501-507 of FIG. 8 can be representative of a process for preparing a conformal electronics device for coupling with an encapsulation housing unit. At block 501, the method 501 includes delivering a conformal electronics device (e.g., FPCBA 302 of FIG. 3A) to a molding house or manufacturing facility. Prior to mounting the conformal electronic device to a transport carrier for priming, as indicated at block 505, the conformal electronic device is inspected at block 503. At block 507, the method 501 includes priming one or more portions of the surface of the conformal electronic device. In these example procedures, portions of the surface of the conformal electronic device can be treated to facilitate coupling with the components of the encapsulation housing unit. For example, portions of the surface of the conformal electronic device can be primed, sprayed, or subjected to deposition of chemicals, corona treatment or a plasma treatment, to facilitate better adhesion or adherence.

Blocks 509-517 of FIG. 8 present representative procedures for molding the various segments of the encapsulation housing unit, such as first and second encapsulation housing components 336 and 338 of FIGS. 3A and 3B, mounting one or both of these segments to a carrier, and applying one or more shots of adhesive(s). At block 509, for example, the method 501 includes molding liquid silicone rubber (LSR) top and bottom halves of an encapsulation housing unit by liquid injection molding (LIM) process in single mold. Once removed from the mold, both the top component and the bottom component are inspected, for example, at blocks 511 and 513. The bottom component (and/or top component) is placed into a transport carrier at block 515, and a first shot/coat of adhesive is applied to one or more portions of the bottom component (and/or top component), as indicated at block 517. In an example, the adhesive can be applied thinly to facilitate a borderline of 1-4 mils thickness. The amount applied should be sufficient to facilitate adhesion or adherence, but not cause flow outside of where it is needed.

With continuing reference to FIG. 8, blocks 519-531 provide example procedures for alignment/placement/attachment/encasing of the conformal electronic device with the housing components. At block 519, for example, the method 501 includes aligning the conformal electronics device, and placing the device onto the bottom housing component. The device can be manually aligned or optically placed such that recess features in the bottom component align with cutouts or other similar features of the device. In another example, the bottom housing component and the device can be self-aligning based on alignment features built into the bottom housing component and/or the device. Once properly aligned and positioned, a second shot/coat of adhesive is applied to one or more portions of the device and/or bottom component at block 521. Additional adhesive can be applied, e.g., to portions of the bottom housing component and/or the device prior to coupling with the top housing component. The type and amount of adhesives to use can be determined, for example, based on the rating of the adhesive.

As the process 501 of FIG. 8 continues, the top component is then coupled with the bottom component at block 523 to provide an assembled stack. Pressure is then applied to the stack at block 525 to cure the adhesive at or near room temperature. An amount of pressure can be applied to facilitate coupling of the top housing to the bottom housing component and the conformal electronic device. The curing can be performed at or near room temperature. In an example, the amount of pressure to apply to the coupled housing components and conformal electronic device can be maintained as low as possible to facilitate curing at temperatures close to room temperature. The assembled unit is then inspected at block 527 and, if inspection is passed, a steel rule die cut is performed on selected assembled units at block 529. For example, the steel rule die cut can be used to remove any unwanted materials or to shape a portion of the assembled unit as desired. Assembled units are then packaged, as indicated at block 531. One or more wells may extend around the circumference of one or both housing components to help ensure proper cosmetic surfaces by eliminating overflow. A roll laminating process can be used to apply pressure and distribute the adhesive evenly throughout the assembly.

In some embodiments, the method includes at least those steps enumerated above and illustrated in the drawings. It is also within the scope and spirit of the present invention to omit steps, include additional steps, combine steps, and/or modify the order presented above. It should be further noted that the foregoing method can be representative of a single sequence for fabricating an encapsulated conformal electronics device. However, it is expected that the method will be practiced in a systematic and repetitive manner.

The example encapsulation housings can be configured with an oval design as illustrated in FIGS. 4A and 4B. In other examples, the encapsulation housing can be configured with other shapes, sizes, configurations, etc. For example, the encapsulation housing unit or component(s) can be molded into non-planar shapes to which the conformal electronic devices can also be conformed. In an example, the non-planar conformation or contouring can be determined based on the shape of the body part or other surface to which the encapsulated conformal electronic device is to be mounted or coupled. The shape, size, configuration, etc., of the encapsulation housing can be determined, for example, to facilitate placement of more fragile or strain sensitive regions of the functional portions of the conformal electronic device at the neutral mechanical plane of the encapsulated conformal electronic device. In an example, the composition or moduli of various portions of the encapsulation housing unit or component(s) can be modulated such that the neutral mechanical surface falls at more fragile or strain sensitive regions of the functional portions of the conformal electronic device at the neutral mechanical plane of the encapsulated conformal electronic device. As non-limiting examples, the more fragile or strain sensitive regions of the conformal electronic device fall at the transition regions between the more rigid device islands and the more stretchable electrically conductive interconnects. The type of deformation that the encapsulated conformal electronic device is to be subjected to, whether a bending or a stretching deformation, can affect how portions of the conformal electronic device are stressed (and hence the more fragile or strain sensitive regions).

Portions of the encapsulation housing unit or component(s) can be shaped or otherwise molded such that some portions are more compliant while other portions are more rigid, for example, to position the neutral mechanical plane at the more fragile or strain sensitive regions of the conformal electronic device. In an example, the types or moduli of the adhesive, or the amount of a portion of the encapsulation housing that is proximate to particular electronic device components, also can be configured to affect placement of the neutral mechanical plane. For some configurations, the example encapsulation housing unit or component(s) can be configured such that portions of the conformal electronic device are floating within the housing, i.e., not in contact with a portion of the housing. In an example, another substance, such as an oil or other liquid, can be placed proximate to a floating portion of the conformal electronic device. The shape and composition of the encapsulation housing unit or component(s) can be varied based on the topography of the conformal electronic device circuitry.

Figure 9A:
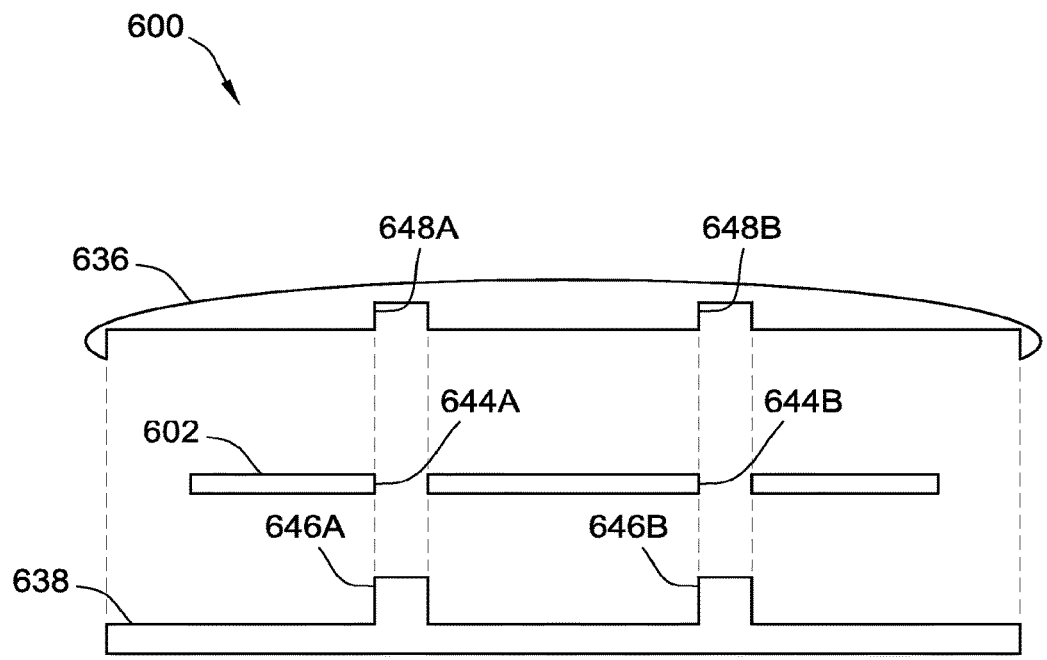
FIGS. 9A and 9B are exploded and assembled cross-sectional side-view illustrations, respectively, of a conformal electronic device encased between top and bottom encapsulation housing components in accord with aspects of the present disclosure.
Figure 9B:
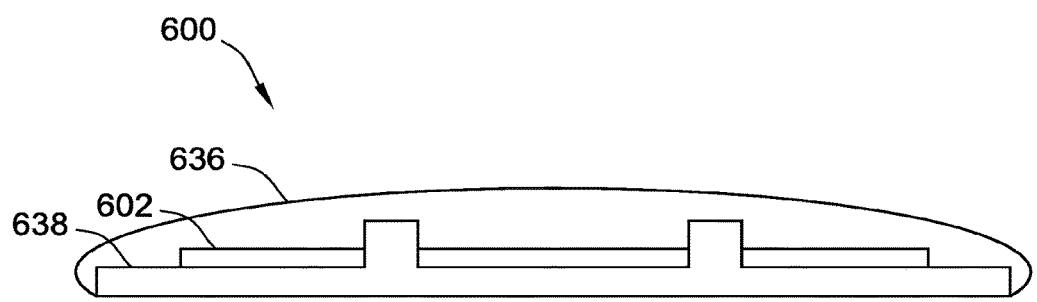

FIGS. 3A and 3B provide the top view and bottom view of the example encapsulated conformal electronic device 300. FIG. 9A presents a cross-sectional side-view illustration of a similar encapsulated conformal electronic device 600 with a conformal electronic device (e.g., an FPCBA 602) and a top encapsulation housing component 636 and the bottom encapsulation housing component 638. In this example, the top housing component 636 includes recess features 648A and 648B, while the bottom housing component 638 includes protrusions 646A and 646B. Conformal electronic device 602 includes a pair of complementary cutouts 644A and 644B through which can be received the protrusions 646A, 646B, respectively. FIG. 9B shows a cross-sectional view of the example assembled encapsulated conformal electronic device 600, including the top component 636, the bottom component 638, and the conformal electronic device 602. The protrusions 646A, 646B of the bottom component 638 mate to the recesses 648A, 648B of the top component 636 through the cutouts 644A, 644B of the conformal electronic device 602.

FIGS. 3A and 5A show the example conformal electronic device 302 with through holes that allow silicone projection features—i.e., projections 346A and 346B—of the bottom housing component 338 to be inserted through the electronic device FPCB 304 and mate with the silicone features—i.e., complementary apertures 348A and 348B—of the other housing component 336. FIGS. 5A and 5B show a top component including recess features that can be used to help align and adhere the components. FIGS. 5A and 5B also show the holes in the conformal electronic device that allow the silicon features from the bottom component inserted through the circuit board to mate with the other silicone component (the top component). FIGS. 5A and 5B also show the protruding features of the bottom component that will help align the conformal electronic device to both the bottom component and the top component.

The encapsulation housing unit or component(s) can include a single size for an electronic component compartment that could house differing sizes of the electronic component. Encapsulation housings can include an over-sized component that can admit differing sizes of batteries or other energy storage components, microprocessors, light-emitting devices, memory units, antennas, or any other device component (including device components described herein). An additional adhesive or other spacer component can be introduced to maintain the electronic component substantially in place within the compartment. In an example, the capability to introduce differing sizes of a device component into the conformal electronic device circuitry facilitates generating differing grades or performance level devices using a single type of encapsulation housing.

Encapsulation housing can be formed from a more rigid material as the outer shell and a more compliant material in the inner portions that are proximate to the conformal electronic device. In such an example, the compliant material can be of sufficient moduli to allow flow through and/or around portions of the conformal electronic device. By way of example, the conformal electronic device can be formed with some lock-and-key device components that lock with other circuit components. For instance, the encapsulation housing unit or component(s) can be formed with a curvilinear design, with one side having a convex conformation and another side having a concave conformation.

Formation of the encapsulation housing unit or component(s) independent from the conformal electronics opens up options for higher temperature processing and wider design freedom. Additionally, there are potentially greater benefits from separating the procedures so that the externally molded the encapsulation housing unit or component(s) can be placed through quality control (inspection) before coupling with the comparatively more expensive conformal electronic module (which can require order of magnitude higher in manufacturing costs).

In an example, the encapsulation housing unit or component(s) includes interdigitated, interlocking features that allow them to pass through holes or other features in the conformal electronic device or to couple with the opposing housing component. This allows for easier alignment and possibly added adhesion strength by virtue of greater bonding surface area than with other encapsulation processes. In any example, the encapsulation housing unit or component(s) can be formed with tongue and groove, flanges, or any other mechanical type features that can aid in the mating.

In an example, an adhesive can be thinned with solvents in order to get to a sufficiently low viscosity that allows the adhesive to be printed, sprayed, brushed on, etc. In manufacturing the adhesive bondline thickness can be thin and well controlled. In an example, choice of an appropriate material and maintaining a thin bondline allow for a seam/parting line that is substantially seamless. In an example, the projections can be added and used for electromechanical and/or environmental testing, or could be used for mounting the encapsulated conformal electronic device to a surface.

In an example, a compartment of the encapsulation housing unit or component(s) can include slightly oversized protruding features such that portions of the conformal electronic device could be maintained in compression within the compartment. In an example, a compartment of the encapsulation housing unit or component(s) can include slightly undersized protruding features such that portions of the conformal electronic device could be left slightly floating within the compartment. Either of these techniques could be used for improving reliability, and/or compensating for dimensional instabilities. For example, the energy storage component (e.g., the battery) is variable so room could be left to accommodate the variability, or alternatively (if the energy storage component can tolerate compression) protruding features could be oversized to maintain the energy storage component compressed.

In any example, the encapsulated conformal electronic device can be configured for any desired degree of resistance to deformation. For example, the encapsulated conformal electronic device can be configured to exhibit slowly growing resistance to deformation until a threshold deformation is reached. In another example, the encapsulated conformal electronic device can be configured to give very little resistance to deformation until a threshold strain limit is reached, then exhibit a stepwise increase in force required to deform further. In any example, the deformation threshold of the encapsulated conformal electronic device can be quantified as a degree of deformation beyond a certain percentage deformation (e.g., a percentage stretching beyond the relaxed dimensions of the device). The encapsulated conformal electronic device can be configured such that, for deformation beyond the threshold, the system exhibits a rigid stop or rapid increase in resistance to deformation, depending on the desired characteristics/properties. The resistance and/or rigid stop can be adjustable so that the user feels the resistance at different intensities to indicate undesirable degree of deformation or maximum deformation (including maximum stretch). In any example herein, different types of fabrics or other materials can be incorporated into at least a portion of the encapsulation material to achieve the desired different force profiles.

Example systems, methods and apparatus according to the principles described herein provide encapsulated flexible and/or stretchable electronics (conformal electronic devices) in the form of elastomeric patches that can be applied to human skin (for example, using an adhesive layer). The encapsulated flexible and/or stretchable electronics are also referred to herein as conformal electronic sensors or conformal electronic devices. The examples conformal electronic devices can be configured, for example, as conformal sensors for sensing, measuring, or otherwise quantifying parameters associated with at least one body part of a human or non-human animal. In some examples, such conformal sensors can be configured to detect and/or quantify motion of a body part or other object. In some examples, the systems, methods, and apparatus described herein can be configured as conformal sensors for sensing, measuring, or otherwise quantifying, motion, including motion and/or muscle activity of at least one body part or other object.

Conformal sensors can be used for sensing, measuring and/or otherwise quantifying at least one parameter associated with portions of the body or other object. In another example, the systems, methods, and apparatus described herein can be configured to use the results of analysis of data indicative of the at least one parameter associated with portions of the body or other object, for such applications as medical diagnosis, medical treatment, physical activity, sports, physical therapy and/or clinical purposes. Data gathered using the example conformal sensors based on sensing the at least one parameter associated with portions of the body or other object, along with data gathered based on sensing other physiological measures of the body, can be analyzed to provide useful information related to medical diagnosis, medical treatment, physical state, physical activity, sports, physical therapy, and/or clinical purposes. When this sensing is performed using the example thin, conformal, and wearable sensors described herein and measurement devices including such sensors, these measures and metrics can be unimpeded by the size, weight or placement of the conformal sensor devices.

The example systems, methods, and apparatus described herein including the conformal sensors can be configured to monitor the body motion and/or muscle activity, and to gather measured data values indicative of the monitoring. The monitoring can be performed in real-time, at different time intervals, and/or when requested. In addition, the example systems, methods, and apparatus described herein can be configured to store the measured data values to a memory of the system and/or communicate (transmit) the measured data values to an external memory or other storage device, a network, and/or an off-board computing device. In any example herein, the external storage device can be a server, including a server in a data center. Non-limiting examples of a computing device applicable to any of the example systems, apparatus or methods according to the principles herein include smartphones, tablets, laptops, slates, e-readers or other electronic reader or hand-held or worn computing device, an Xbox®, a Wii®, or other game system(s).

This example systems, methods, and apparatus can be used to provide ultra-thin and conformal electrodes that facilitate monitoring and diagnosis of subjects, including when combined with measurements of at least one parameter associated with portions of the body or other object. In combination with pharmaceuticals, this information can be used to monitor and/or determine subject issues including compliance with and/or effects of, treatment regimens.

The example conformal sensors can be configured to include electronics for performing measurements of at least a parameter of an object or a body part that is proximate to the conformal sensor. An example conformal sensor system can include electronics for performing at least one of an accelerometry measurements and a muscle activation measurement. In other examples, the conformal sensor system can include electronics for performing at least one other measurement, such as but not limited to heart rate measurements, electrical activity measurements, temperature measurements, hydration level measurements, neural activity measurements, conductance measurements, environmental measurements, and/or pressure measurements. For example, the conformal sensors can be configured to perform any combination of two or more of these different types of measurements.

In various examples, the conformal electronic sensor devices described herein can include one or more passive electronic components and/or one or more active electronic components. Non-limiting examples of components that can be included in the conformal electronics device according to the principles described herein include a transistor, an amplifier, a photodetector, a photodiode array, a display, a light-emitting device (LED), a photovoltaic device, a sensor (such as but not limited to an electromagnetic radiation sensor, a temperature sensor, and/or a tissue condition sensor), a semiconductor laser array, an optical imaging system, a large-area electronic device, a logic gate array, a microprocessor, an integrated circuit, an electronic device, an optical device, an opto-electronic device, a mechanical device, a microelectromechanical device, a nanoelectromechanical device, a microfluidic device, a thermal device, and other device structures.

Figure 10:
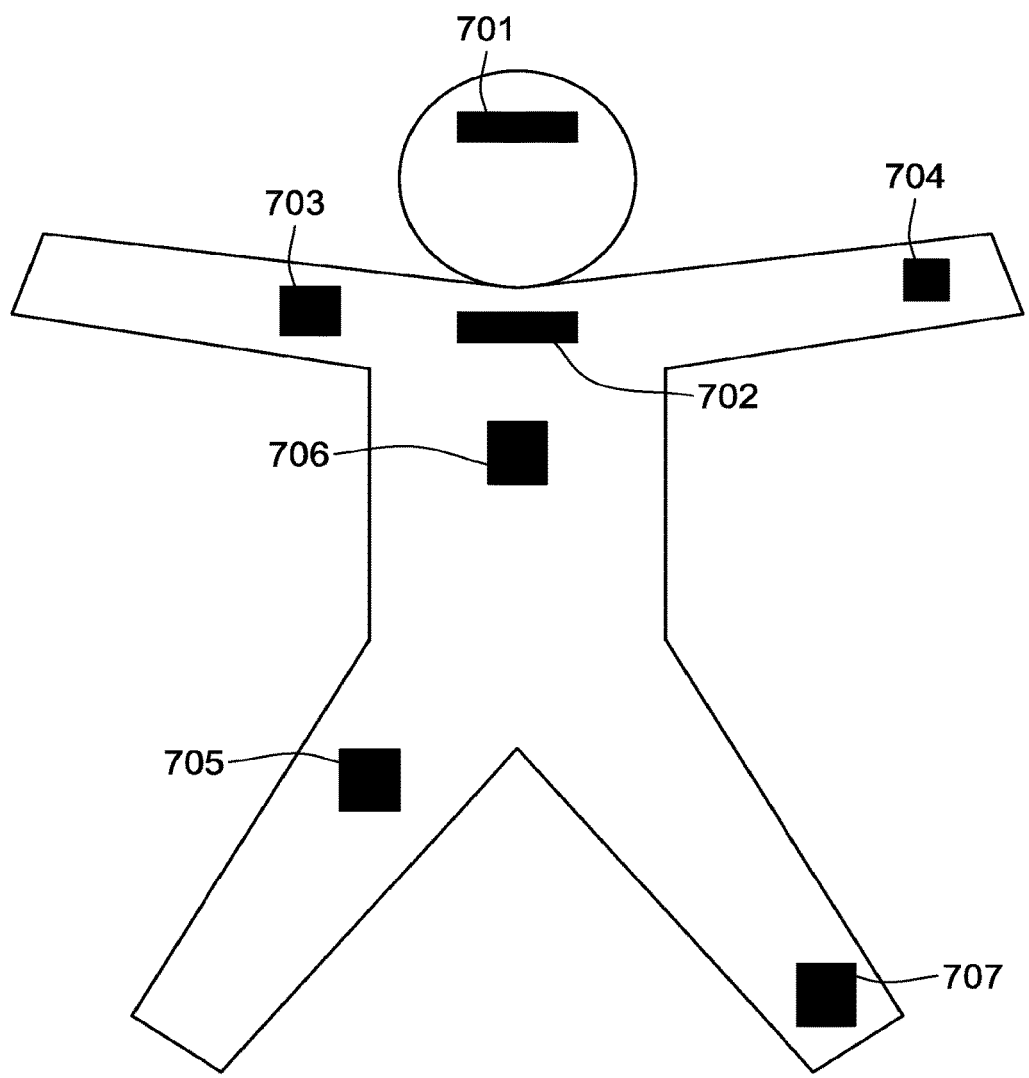
FIG. 10 illustrates examples of areas of the body to which an encapsulated conformal electronic device can be disposed in accord with aspects of the present disclosure.

FIG. 10 shows non-limiting examples of areas of the body proximate to which the example encapsulated conformal electronic device can be disposed, including portions of the face or head 701, neck or shoulder 702, arm 703, hand/wrist 704, knee, thigh, hip or rear 705, torso or back 706, or lower leg or foot 707.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways. Some embodiments may be implemented using hardware, software, CAD, CAM, FEA or a combination thereof. When any aspect of an embodiment is implemented at least in part in software, the software code may be executed on any suitable processor or collection of processors, whether provided in a single device or computer or distributed among multiple devices/computers. Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the claims. Moreover, the present concepts expressly include any and all combinations and subcombinations of the preceding elements and aspects.

What is claimed is:

1. A conformal integrated circuit (IC) device comprising:
a flexible substrate;
an electronic circuitry attached to the flexible substrate; and
a flexible multi-part encapsulation housing at least substantially encasing therein the electronic circuitry and the flexible substrate, the multi-part encapsulation housing including a first encapsulation housing component attached to a second encapsulation housing component, the first encapsulation housing component having at least one first recessed region for seating therein the electronic circuitry, and the second encapsulation housing component having at least one second recessed region for seating therein the flexible substrate,
wherein the electronic circuitry includes a plurality of device islands and a plurality of stretchable electrical interconnects electrically connecting two or more of the device islands.

2. The conformal IC device of claim 1, wherein the least one first recessed region of the first encapsulation housing component comprises at least one recessed substrate region for seating therein the flexible substrate.

3. The conformal IC device of claim 1, wherein the electronic circuitry comprises a plurality of electrically interconnected IC devices, and wherein the at least one first recessed region comprises a plurality of pockets for seating therein the IC devices.

4. The conformal IC device of claim 1, wherein the flexible substrate has one or more through holes, the first encapsulation housing component having a first projection that protrudes into a first of the one or more through holes to thereby align and interlock the first encapsulation housing component with the flexible substrate and the electronic circuitry.

5. The conformal IC device of claim 1, wherein the flexible substrate has one or more through holes, the second encapsulation housing component having a second projection that passes through a second of the one or more through holes and engages a complementary aperture in the first encapsulation housing component to thereby align and interlock the first and second encapsulation housing components with the flexible substrate and the electronic circuitry.

6. The conformal IC device of claim 1, wherein the flexible multi-part encapsulation housing has a durometer hardness rating of at least about 20 Shore A and a tear strength of at least about 80 pounds per inch (ppi).

7. The conformal IC device of claim 1, wherein the flexible multi-part encapsulation housing is fabricated from a stretchable and bendable non-conductive material.

8. The conformal IC device of claim 1, wherein the first and second encapsulation housing components are molded from liquid silicone rubber (LSR) materials in a liquid injection molding (LIM) process.

9. The conformal IC device of claim 1, wherein the first and second encapsulation housing components are adhered together such that the flexible substrate and the electronic circuitry are sandwiched between the first and second encapsulation housing components.

10. The conformal IC device of claim 1, wherein the flexible substrate and the electronic circuitry cooperatively form a flexible printed circuit board assembly (FPCBA).

11. The conformal IC device of claim 1, wherein the flexible multi-part encapsulation housing is configured to hermetically seal the flexible substrate and the electronic circuitry.

12. The conformal IC device of claim 1, wherein the electronic circuitry comprises an integrated circuit sensor system with at least one sensing device and at least one controller device.

13. The conformal IC device of claim 1, wherein the flexible multi-part encapsulation housing completely encases therein the electronic circuitry and the flexible substrate.

14. An encapsulated conformal electronics device comprising:
a flexible printed circuit board (FPCB);
a plurality of surface-mount technology (SMT) components configured as integrated circuit (IC) devices mounted on the FPCB;
a plurality of stretchable electrical interconnects electrically connecting two or more of the SMT components; and
a flexible bipartite encapsulation housing encasing therein the FPCB, the SMT components and the stretchable electrical interconnects, the flexible bipartite encapsulation housing including top and bottom housings segments, the top encapsulation housing segment having first prefabricated recessed regions for seating therein the SMT components and the stretchable electrical interconnects, and the bottom encapsulation housing segment having second prefabricated recessed regions for seating therein the FPCB.

15. The encapsulated conformal electronics device of claim 14, wherein the flexible bipartite encapsulation housing completely encases therein the SMT components, the stretchable electrical interconnects, and the FPCB.

16. A method for encapsulating a conformal electronic device, the method comprising:
molding a top flexible encapsulation housing component;
molding a bottom flexible encapsulation housing component;
placing the bottom flexible encapsulation housing component into an assembly fixture;
dispensing a first shot of adhesive onto the bottom flexible encapsulation housing component;
placing a flexible printed circuit board assembly (FPCBA) on top of the first shot of adhesive and the bottom flexible encapsulation housing component in the assembly fixture;
dispensing a second shot of adhesive onto the FPCBA and the bottom flexible encapsulation housing component; and
placing the top flexible encapsulation housing component on top of the FPCBA and the second shot of adhesive in the assembly fixture to create a stack and thereby encase the FPCBA between the top and bottom flexible encapsulation housing components,
wherein the FPCBA comprises a flexible substrate and a plurality of device islands electrically connected via stretchable electrical interconnects, and wherein the top encapsulation housing component comprises a first recessed substrate region for seating therein the flexible substrate.

17. The method of claim 16, further comprising applying pressure to the stack to thereby cure the adhesive at or near room temperature.

18. The method of claim 16, further comprising performing a die cut on the stack.

19. The method of claim 16, further comprising priming portions of the FPCBA prior to dispensing the second shot of adhesive.

20. The method of claim 16, wherein the plurality of device islands include spaced IC devices electrically connected via electrical interconnects, and wherein the top flexible encapsulation housing component comprises a plurality of pockets for seating therein the IC devices and the electrical interconnects.

21. The method of claim 16, wherein the bottom encapsulation housing component comprises a second recessed substrate region for seating therein the flexible substrate.

22. The method of claim 16, wherein the FPCBA is completely encased between the top and bottom flexible encapsulation housing components.

23. The method of claim 20, wherein the FPCBA is completely encased between the top and bottom flexible encapsulation housing components.

24. The method of claim 21, wherein the FPCBA is completely encased between the top and bottom flexible encapsulation housing components.

* * * * *